United States Patent
Liaw

(10) Patent No.: US 9,099,172 B2
(45) Date of Patent: Aug. 4, 2015

(54) DUAL-PORT SRAM CONNECTION STRUCTURE

(71) Applicant: Taiwan Semiconductor Manufacturing Company, Ltd., Hsin-Chu (TW)

(72) Inventor: Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 17 days.

(21) Appl. No.: 13/732,980

(22) Filed: Jan. 2, 2013

(65) Prior Publication Data

US 2014/0185365 A1    Jul. 3, 2014

(51) Int. Cl.
G11C 8/16    (2006.01)

(52) U.S. Cl.
CPC ......................................... *G11C 8/16* (2013.01)

(58) Field of Classification Search
CPC ........................................................ G11C 8/16
USPC ............................................. 365/156, 230.05
See application file for complete search history.

(56) References Cited

U.S. PATENT DOCUMENTS

| 7,405,994 | B2 | 7/2008 | Liaw | |
| 8,009,463 | B2 | 8/2011 | Liaw | |
| 2011/0317477 | A1* | 12/2011 | Liaw | 365/156 |

OTHER PUBLICATIONS

Liaw, Jhon Jhy, Application No. 10-2013-0083581, Korean Office Action dated Sep. 30, 2014.

\* cited by examiner

*Primary Examiner* — Jason Lappas
(74) *Attorney, Agent, or Firm* — Haynes and Boone, LLP

(57) ABSTRACT

The present disclosure provides a static random access memory (SRAM) cell. The SRAM cell includes first and second inverters cross-coupled for data storage, each inverter including at least one pull-up device and at least two pull-down devices; at least four pass gate devices configured with the two cross-coupled inverters; at least two ports coupled with the at least four pass-gate devices for reading and writing; a first contact feature contacting first two pull-down devices (PD-11 and PD-12) of the first inverter; and a second contact feature contacting second two pull-down devices (PD-21 and PD-22) of the second inverter.

20 Claims, 17 Drawing Sheets

DUAL-PORT SRAM CONNECTION STRUCTURE

BACKGROUND

In deep sub-micron integrated circuit technology, an embedded static random access memory (SRAM) device has become a popular storage unit of high speed communication, image processing and system-on-chip (SOC) products. For example, a dual port (DP) SRAM device allows parallel operation, such as 1R (read) 1W (write), or 2R (read) in one cycle, and therefore has higher bandwidth than a single port SRAM. In advanced technologies with decreased feature size and increased packing density, low loading and high speed of the cell structure are important factors in embedded memory and SOC products. Various gate structures are implemented to achieve high packing density and high speed. For example, a U-shaped gate structure is employed in the SRAM structure. However, the U-shaped gate structure induces potential issues including pull-down (PD) device variation and integration concerns on fin-like field-effect transistor (FinFET) structure. Furthermore, the critical dimension uniformity (CDU) in the U-shaped gate structure also introduces necking and leakage problems. Accordingly, the U-shaped gate structure impacted the SRAM cell stability and limited the scaling (or shrink) capability. It is therefore desired to have a new structure and method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
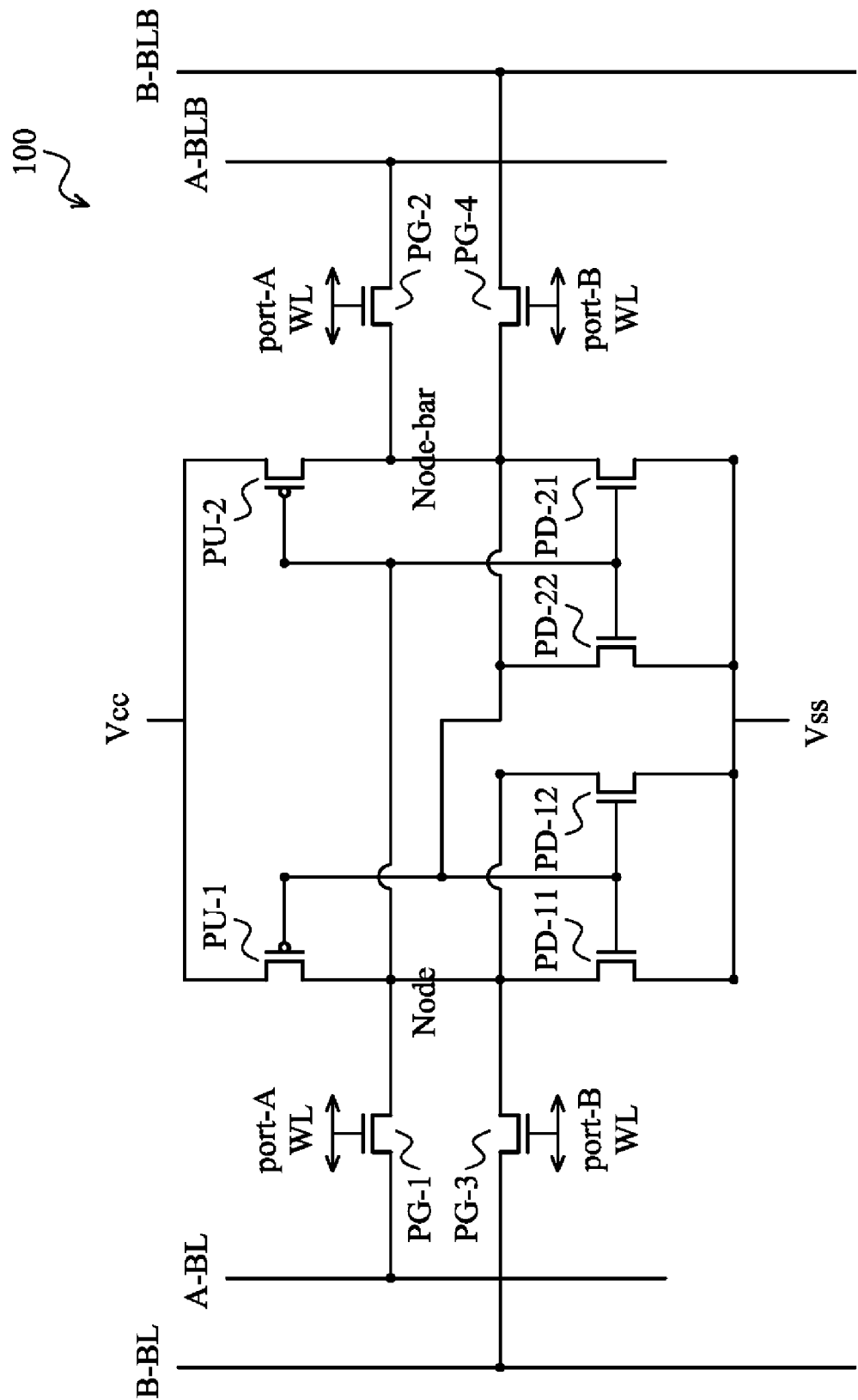
FIG. 1 is a schematic view of a dual port static random access memory (DP SRAM) cell constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a dual-port (DP) SRAM cell 100 constructed according to various aspects of the present disclosure in one embodiment. In one embodiment, the DP SRAM cell 100 includes fin field-effect transistors (FinFETs). In another embodiment, the DP SRAM cell 100 includes planar field-effect transistors (FETs). The DP SRAM cell 100 includes first and second inverters that are cross-coupled. The first inverter includes a first pull-up device formed with a p-type field-effect transistor (pFET), referred to as PU-1. The first inverter also includes a first plurality of pull-down devices formed with n-type field-effect transistors (nFETs) and configured in parallel mode. Specifically, the drains of the first plurality pull-down devices are electrically connected together, the corresponding sources are electrically connected together, and the corresponding gates are electrically connected together. The second inverter includes a second pull-up device formed with a pFET, referred to as PU-2. The second inverter also includes a second plurality of pull-down devices formed with nFETs and configured in parallel mode. The number of the first plurality of pull-down devices and the number of the second plurality of pull-down devices are equal for a balanced cell structure. In one embodiment, the first plurality of pull-down devices includes two nFETs, referred to as PD-11 and PD-12, respectively. In one embodiment, the second plurality of pull-down devices includes two nFETs, referred to as PD-21 and PD-22, respectively.

The drains of PU-1, PD-11 and PD-12 are electrically connected together, defining a first drain node (or first node). The drains of PU-2, PD-21 and PD-22 are electrically connected together, defining a second drain node (or second node). The gates of PU-1, PD-11 and PD-12 are electrically connected and coupled to the second node. The gates of PU-2, PD-21 and PD-22 are electrically connected and coupled to the first node. The sources of PU-1 and PU-2 are electrically connected to the power line (Vcc line). The sources of PD-11, PD-12, PD-21, and PD-22 are electrically connected to a complementary power line (Vss line). In one embodiment of the DP SRAM cell layout, the sources of PD-11 and PD-12 are electrically connected to a first Vss line while the sources of PD-21 and PD-22 are electrically connected to a second Vss line.

The DP SRAM cell 100 further includes a first port (port-A) and a second port (port-B). In one embodiment, the port-A and port-B include at least four pass-gate devices, referred to as PG-1, PG-2, PG-3 and PG-4, respectively. The port-A includes a first pass-gate device (PG-1) and a second pass-gate device (PG-2). The port-B includes a third pass-gate device (PG-3) and a fourth pass-gate device (PG-4). The drain of PG-1 is electrically connected to a first bit-line (referred to as A_BL). The source of PG-1 is electrically connected to the first node. The gate of PG-1 is electrically connected to a first word-line (referred to as port-A WL). The drain of PG-2 is electrically connected to a first bit-line bar (A_BLB). The source of PG-2 is electrically connected to the second node. The gate of PG-2 is electrically connected to a first word-line (port-A WL). The drain of PG-3 is electrically connected to a second bit-line (B_BL). The source of PG-3 is electrically connected to the first node. The gate of PG-3 is electrically connected to the second word-line (port-B WL). The drain of PG-4 is electrically connected to a second bit-line bar (B_BLB). The source of PG-4 is electrically connected to the second node. The gate of PG-4 is electrically connected to the second word-line (port-B WL).

The cell 100 may include additional devices such as additional pull-down devices and pass-gate devices. Specifically, the first inverter includes a number of pull-down devices configured in parallel similar to the configuration of PD-11 and PD-12. More specifically, the drains of the pull-down devices in the first inverter are electrically connected together. The sources of the pull-down devices in the first inverter are electrically connected together. The gates of the pull-down devices in the first inverter are electrically connected together. The second inverter includes the same number of pull-down devices configured in parallel similar to the configuration of PD-21 and PD-22 for balance. Specifically, the drains of the pull-down devices in the second inverter are electrically connected together. The sources of the pull-down devices in the second inverter are electrically connected together. The gates of the pull-down devices in the second inverter are electrically connected together.

The first port includes the first pass-gate device or a number of the first pass-gate devices (still referred to PG-1) configured in parallel. Specifically, the number of the first pass-gate devices are configured such that the drains, sources and gates are electrically connected together, respectively. More specifically, the drains of the first pass-gate devices (PG-1) are electrically connected to a first bit-line (A_BL). The sources of PG-1 are electrically connected to the first node. The gates of PG-1 are electrically connected to a first word-line (port-A WL).

Similarly, the first port includes the second pass-gate device or the same number of the second pass-gate devices (still referred to PG-2) configured in parallel. Specifically, the number of the second pass-gate devices are configured such that the drains, sources and gates are electrically connected together, respectively. More specifically, the drains of PG-2 are electrically connected to a first bit-line bar (A_BLB). The sources of PG-2 are electrically connected to the second node. The gates of PG-2 are electrically connected to a first word-line (port-A WL).

The second port includes the third pass-gate device or the same number of the third pass-gate devices (still referred to PG-3) configured in parallel. Specifically, the number of the third pass-gate devices are configured such that the drains, sources and gates are electrically connected together, respectively. More specifically, the drains of PG-3 are electrically connected to a second bit-line (B_BL). The sources of PG-3 are electrically connected to the first node. The gates of PG-3 are electrically connected to the second word-line (port-B WL).

The second port includes the fourth pass-gate device or the same number of the fourth pass-gate devices (still referred to PG-4) configured in parallel. Specifically, the number of the fourth pass-gate devices are configured such that the drains, sources and gates are electrically connected together, respectively. More specifically, the drains of PG-4 are electrically connected to a second bit-line bar (B_BLB). The sources of PG-4 are electrically connected to the second node. The gates of PG-4 are electrically connected to the second word-line (port-B WL).

In the present embodiment of the SRAM cell 100, the total number of the FETs in the cell is greater than 12.

Figure 2:
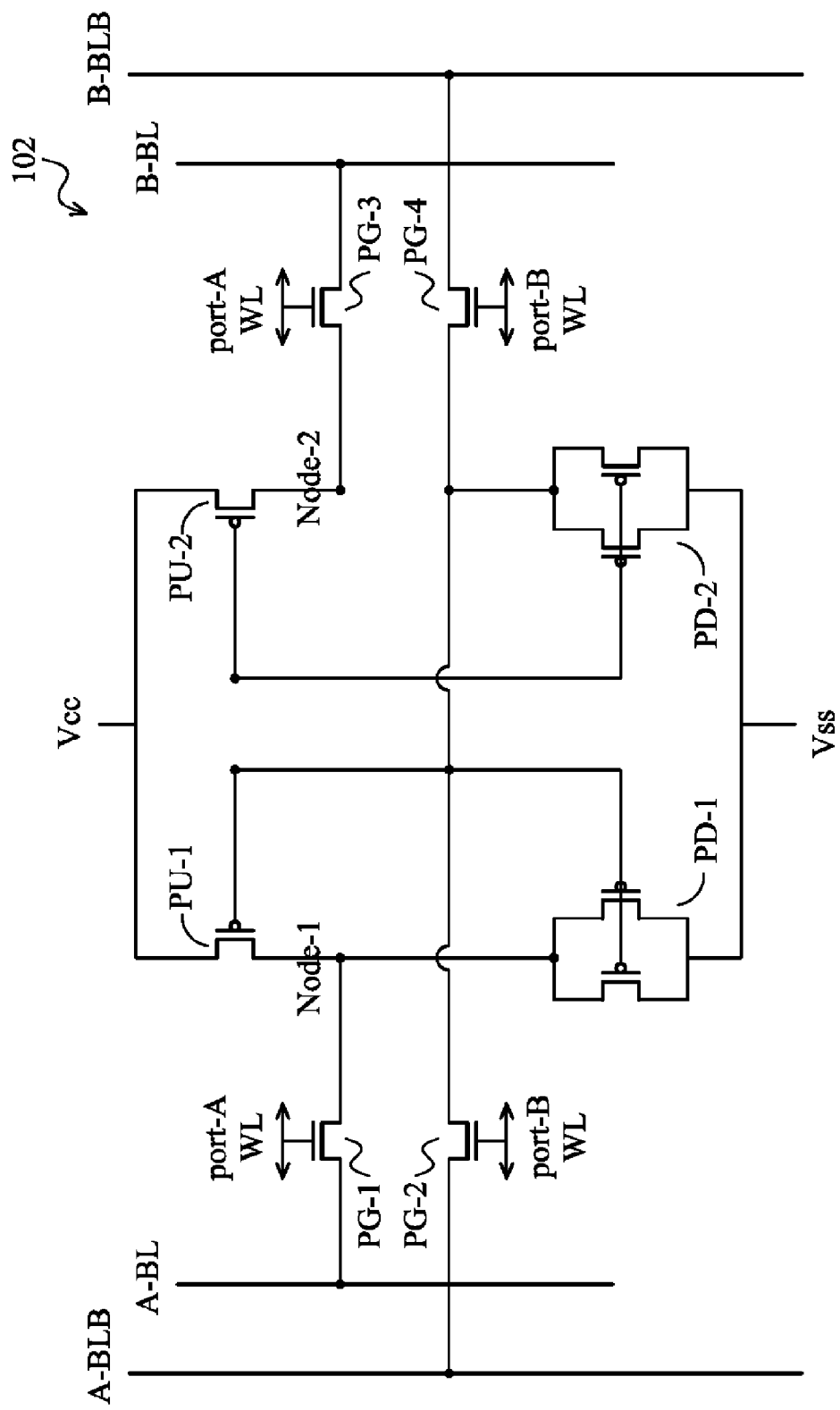
FIG. 2 is a schematic view of a DP SRAM cell constructed according to various aspects of the present disclosure in another embodiment.

FIG. 2 is a schematic view of a dual-port (DP) SRAM cell 102 constructed according to various aspects of the present disclosure in another embodiment. The SRAM cell 102 is similar to the SRAM cell 100 of FIG. 1 but with different routing and configuration as illustrated in FIG. 2.

Figure 3:
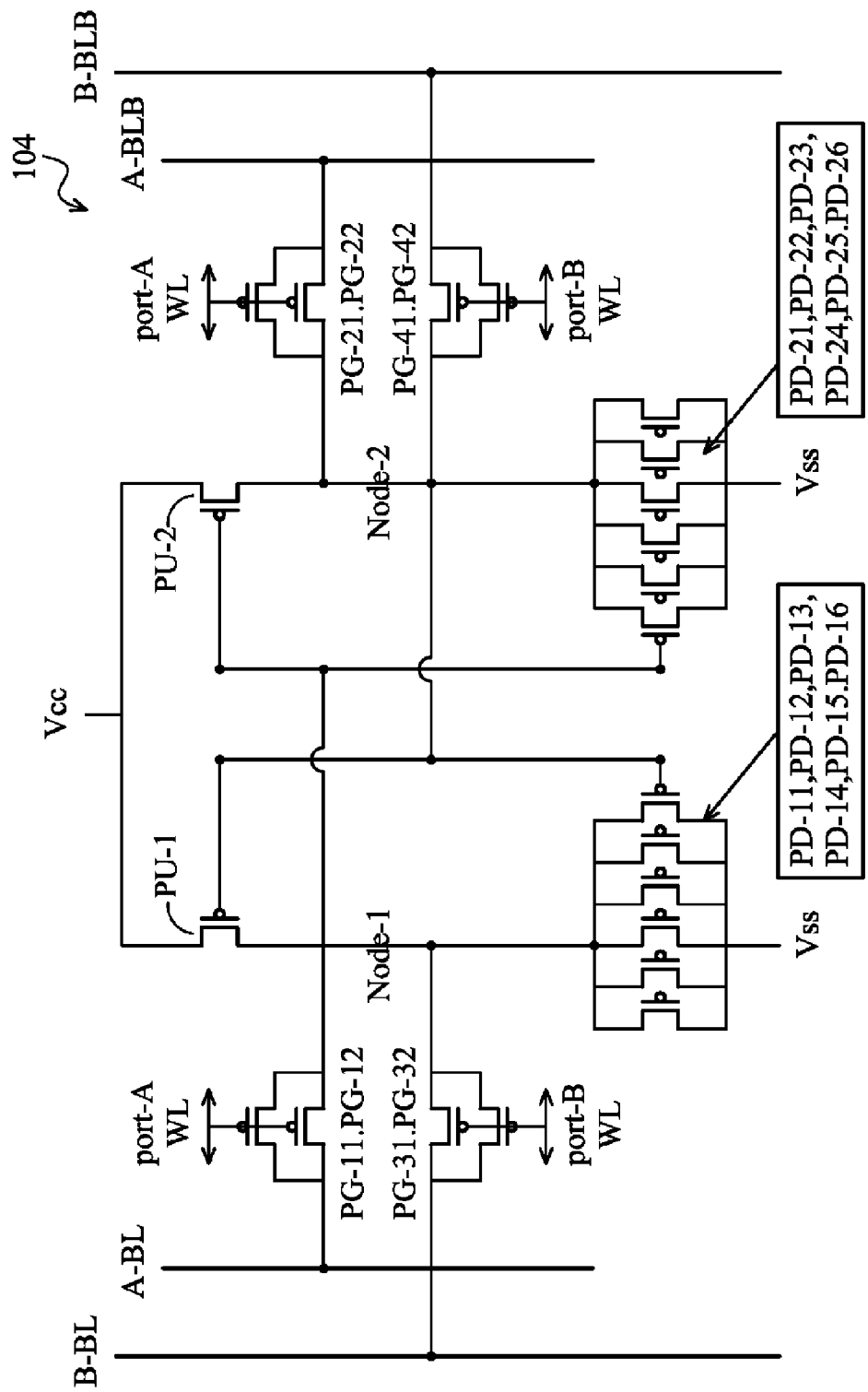
FIG. 3 is a schematic view of a DP SRAM cell constructed according to various aspects of the present disclosure in another embodiment.

FIG. 3 is a schematic view of a dual-port (DP) SRAM cell 104 constructed according to various aspects of the present disclosure in yet another embodiment. The SRAM cell 104 is similar to one embodiment of the SRAM cell 100 in FIG. 1 where the number of the pull-down devices and the number of the pass-gate devices are more than four. In the SRAM cell 104, the first inverter includes 6 pull-down devices PD-11, PD-12, PD-13, PD-14, PD-15 and PD-16. The second inverter includes 6 pull-down devices PD-21, PD-22, PD-23, PD-24, PD-25 and PD-26. Additionally, the SRAM cell 104 includes 8 pass gate devices configured to form the first and second ports. Specifically, the port-A includes 4 pass-gate devices PG-11, PG-12, PG-21 and PG-22. The port-B includes 4 pass-gate devices PG-31, PG-32, PG-41 and PG-42. The drains of PG-11 and PG-12 are electrically connected to a first bit-line (A_BL). The sources of PG-11 and PG-12 are electrically connected to the first node. The gates of PG-11 and PG-12 are electrically connected to a first word-line (referred to as port-A WL). The drains of PG-21 and PG-22 are electrically connected to a first bit-line bar (A_BLB). The sources of PG-21 and PG-22 are electrically connected to the second node. The gates of PG-21 and PG-22 are electrically connected to a first word-line (port-A WL). The drains of PG-31 and PG-32 are electrically connected to a second bit-line (B_BL). The sources of PG-31 and PG-32 are electrically connected to the first node. The gates of PG-31 and PG-32 are electrically connected to the second word-line (port-B WL). The drains of PG-41 and PG-42 are electrically connected to a second bit-line bar (B_BLB). The sources of PG-41 and PG-42 are electrically connected to the second node. The gates of PG-41 and PG-42 are electrically connected to the second word-line (port-B WL).

In the SRAM cell 104, the number of the pull-down devices is greater than the number of the pass-gate devices. Specifically, a ratio "R" is defined as $R=Npd/Npg$ where Npd is a number of the pull-down devices in a SRAM cell and Npg is a number of the pass gate devices in the SRAM cell. The ratio R is greater than 1 to increase sink current, access speed, and device reliability of the SRAM cell. The ratio R may be 3/2, 2, or 5/4 in various examples. The total number of the nFETs and pFETs in the cell is greater than 12 such that the ratio R is tuned to be greater than 1. In the present embodiment illustrated in FIG. 3, the ratio R is 3/2, and the total number of FETs is 22.

In one embodiment, the SRAM cell 104 (or 100 or 102) includes fin-like active regions and FinFETs with enhanced performance and increased packing density. Various n-typeFinFETs (nFinFETs) and p-type FinFETs (pFinFETs) may be formed by any proper technology. In one embodiment, the various nFinFETs and pFinFETs are formed by a process including etching a semiconductor to form trenches, partially filling the trenches to form shallow trench isolation (STI) features and fin active regions. In furtherance of the present embodiment, an epitaxy semiconductor layer is selectively formed on the fin active region. In another embodiment, the various FinFETs are formed by a process including depositing a dielectric material layer on the semiconductor substrate, etching the dielectric material layer to form openings thereof, selective epitaxy growing a semiconductor material (such as silicon) on the semiconductor substrate within the openings to form fin active regions and STI features. In another embodiment, the various FinFETs may include strained features for enhanced mobility and device performance. For example, the pFinFETs include epitaxy grown silicon germanium on a silicon substrate. For another example, the pFinFETs include epitaxy grown silicon carbide on the silicon substrate. In another embodiment, the various FinFETs are formed using high k/metal gate technology where the gate includes a gate dielectric having high k dielectric material and a gate electrode having metal.

In the DP SRAM cell 100, 102 and 104 (collectively referred to as DP SRAM cell), various FETs are coupled by an interconnect structure having contacts, vias and metal lines. Especially, the DP SRAM cell includes contact features and/or via features designed and configured to address the issues discussed in the background. In one embodiment, the DP SRAM cell includes a long contact feature landing on and contacting gates of two or more pull-down devices. In furtherance of the embodiment, the gates of the pull-down devices are aligned in a first direction and the long contact feature is aligned in a second direction perpendicular to the first direction. In another embodiment, the contact features respectively connecting the pass-gate devices are positioned in an asymmetric configuration. In furtherance of the embodiment, in an array of DP SRAM cells, the contact features associated pass-gate devices of the multiple cells are designed in a zigzag configuration. In yet another embodiment, the DP SRAM cell includes a long self-aligned contact feature oriented with two adjacent parallel gates and self-aligned between the two adjacent parallel gates. In yet another embodiment, the DP SRAM cell includes a zero via layer (Via-0 layer) vertically disposed between the contact layer and the first metal layer (M1 layer). The Via-0 layer includes various via features (Via-0 features) to provide vertical connections between the contact features in the contact layer and the metal lines in the M1 layer for space enlargement and packing density enhancement. Various embodiments are further described below with reference to FIGS. 4 through 17.

Figure 4:
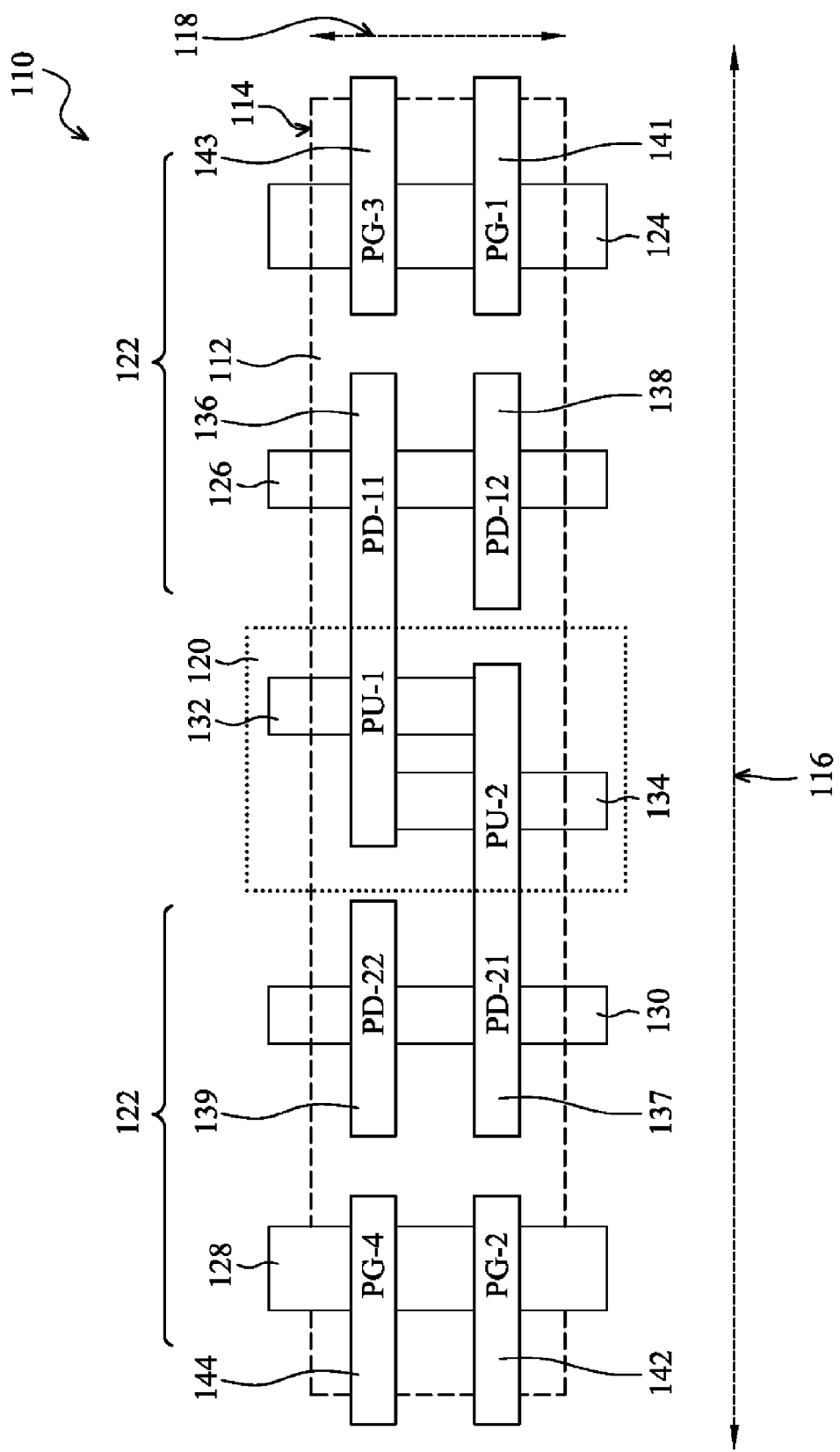
FIGS. 4, 5, 6, 7 and 9 are top views of a DP SRAM cell constructed according to various aspects of the present disclosure in one embodiment.

FIG. 4 is a top view of a DP SRAM cell 110 constructed according to various aspects of the present disclosure in one embodiment. In one embodiment, the DP SRAM cell 110 is a portion of the DP SRAM cell 100 in a particular configuration. The DP SRAM cell 110 includes one cell of a DP SRAM array and is formed on a semiconductor substrate. The semiconductor substrate includes silicon. Alternatively, the substrate includes germanium, silicon germanium or other proper semiconductor materials. The semiconductor substrate may include other proper features and structures. In one embodiment, the semiconductor substrate employs a layer of semiconductor material formed over an insulating layer on a supporting bulk wafer for isolation. The technology and structure is referred to as semiconductor on isolation (SOI). The SOI structure can be formed by different techniques including separation by implanted oxygen (SIMOX), bonding and etching back (BESOI), and zone melting and recrystallization (ZMR).

The DP SRAM cell 110 is formed in a unit cell region 112 of the semiconductor substrate. The unit cell region 112 is defined by the unit cell boundary 114. In one embodiment, the unit cell region 112 is defined in a rectangular shape spanning to a first dimension 116 in a first direction and spanning to a second dimension 118 in a second direction perpendicular to the first direction. The first dimension 116 is greater than the second dimension 118. The first and second dimensions (116 and 118) are referred to as a long pitch and a short pitch, respectively. In one embodiment, a SRAM array having a plurality of cells is configured to form a two-dimensional periodic structure with periodic constants as the long pitch and short pitch in the first and second directions, respectively. The first and second directions are also referred to by numerals 116 and 118, respectively. The SRAM cell 110 includes an N-well region 120 disposed in the central portion of the cell. The SRAM cell 110 further includes a P-well region 122 disposed on the both sides of the N-well 120. In one embodiment, the N-Well 120 and P-well 122 are extended to multiple cells beyond the unit cell boundary. For example, the N-well 120 and P-well 122 are extended to 4 or more cells in the second direction. In another embodiment, the N-well 120 or P-well is not a continuous structure and may be defined in associated active regions.

Various active regions are defined in the substrate by isolation features and are isolated from each other by the isolation features. The isolation features are formed in the semiconductor substrate with a proper technology. In one embodiment, the isolation features are formed by a shallow trench isolation (STI) technique. In another embodiment, the isolation features are alternatively formed by a local oxidation of silicon (LOCOS) technique. In yet another embodiment, the formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. The active regions are defined in the semiconductor substrate upon the formation of the isolation features. In the present embodiment, the FETs in the SRAM cell 110 are planar transistors formed in the planar active regions.

In one embodiment, the DP SRAM cell 110 includes a first active region 124, a second active region 126, a third active region 128 and a fourth active region 130 formed in the P-well 122. The DP SRAM cell 110 further includes a fifth active region 132 and a sixth active region 134 formed in the N-well 120. The first active region 124 through the sixth active region 134 have elongated shapes and are oriented in the second direction and distributed along the first dimension. The first through sixth active regions or a subset thereof may be extended to multiple cells, such as 4 or more cells in the second direction.

In each fin active feature, one or more pull-down device (PD), one or more pass-gate device (PG), or a combination thereof can be formed. Particularly, each active feature includes one PD, one PG, two PDs, two PGs, or PD/PG (one PD and one PG). In the present embodiment, the pass-gates PG-1 and PG3 are formed on the active region 124. The pull-down devices PD-11 and PD-12 are formed on the active region 126. Similarly, for a balanced structure of the SRAM cell 110, the pass-gates PG-2 and PG4 are formed on the active region 128. The pull-down devices PD-21 and PD-22 are formed on the fin active region 130. As to the pull-up devices, the fifth and sixth active regions 132 and 134 are disposed in the N-well 120. The pull-up device PU-1 is formed on the fifth active region 132 and the pull-up device PU-2 is formed on the sixth active region 134.

Various gate features (or gates) are formed within the DP SRAM cell 110 for various nFETs and pFETs. A gate feature includes a gate dielectric layer (such as silicon oxide) and a gate electrode (such as doped polysilicon) disposed on the gate dielectric layer. In another embodiment, the gate feature alternatively or additionally includes other proper materials for circuit performance and manufacturing integration. For example, the gate dielectric layer includes high k dielectric material layer. The gate electrode includes metal, such as aluminum, copper, tungsten or other proper conductive material. Various gates are oriented in the first direction 116 and configured with the various active regions to form respective pull-up devices, pull-down devices and pass-gate devices.

In the present embodiment, a long gate 136 is disposed over the active region 126 and further extends over the fifth active region 132, forming PD-11 and PU-1, respectively. Similarly, another long gate 137 is disposed over the active region 130a and further extended over the sixth active region 134, forming PD-21 and PU-2, respectively. A short gate 138 is disposed on the active region 126 and configured to form PD-12. Similarly, another short gate 139 is disposed on the active region 130 and configured to form PD-22. Other four gates 141, 142, 143 and 144 are disposed on active regions 124 and 128, forming the pass-gate devices PG-1, PG-2, PG-3 and PG-4, respectively.

In the present embodiment, PD-11 and PD-12 share a first common drain, PD-21 and PD-22 share a second common drain, PG-1 and PG-3 share a third common drain and PG-2 and PG-4 share a fourth common drain.

In another embodiment of the configuration as illustrated in FIG. 4, the first active region 124 through the fourth active region 130 in the P-well 122 and the associated pull-down devices and pass-gate devices are symmetrically disposed on the two sides of the N-well 120.

Figure 5:
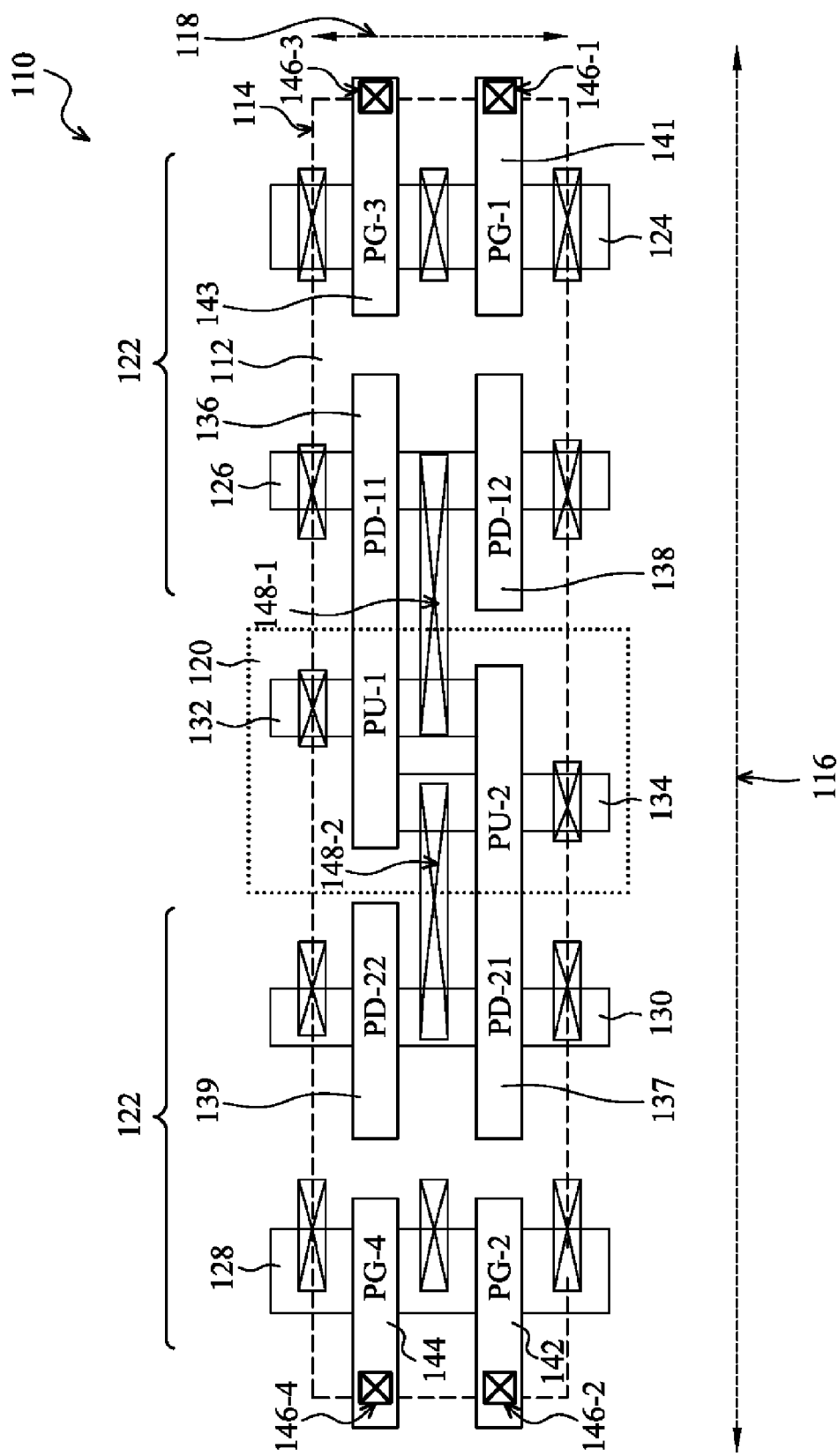

FIG. 5 illustrates a top view of the DP SRAM cell 110, including interconnect features. Various interconnect structures may be utilized to couple the nFETs and pFETs to form the functional SRAM cell. Those contact features contacting active regions are also referred to as active contact features. Those contact features contacting gates are also referred to as gate contact features. In one embodiment, the SRAM cell 110 includes gate contact features 146-1, 146-2, 146-3 and 146-4 landing on the gates 141, 142, 143 and 144, respectively. The SRAM cell 110 also includes active contacts features 148 disposed on the active regions 124, 126, 128, 130, 132 and 134 and directly landing on the respective active regions, as illustrated in FIG. 5. Particularly, those active contact features contact sources, drains or common drains of the respective FETs. In the present embodiment, the active contact features 148 have elongated shape and length dimensions are aligned in the first direction. The active contact features 148 are not individually labeled in FIG. 5 for simplicity. Only two exemplary ones are labeled out. Labeled as 148-1 is one of the active contact features 148 disposed on the active region 126 between the gates 136 and 138. Labeled as 148-2 is one of the active contact features 148 disposed on the active region 130 between the gates 137 and 139. Particularly, the active contact feature 148-1 contacts the common drain of PD-11 and PD-12 and is further extended to the drain of PU-1. The active contact feature 148-2 contacts the common drain of PD-21 and PD-22 and is further extended to the drain of PU-2.

Figure 6:
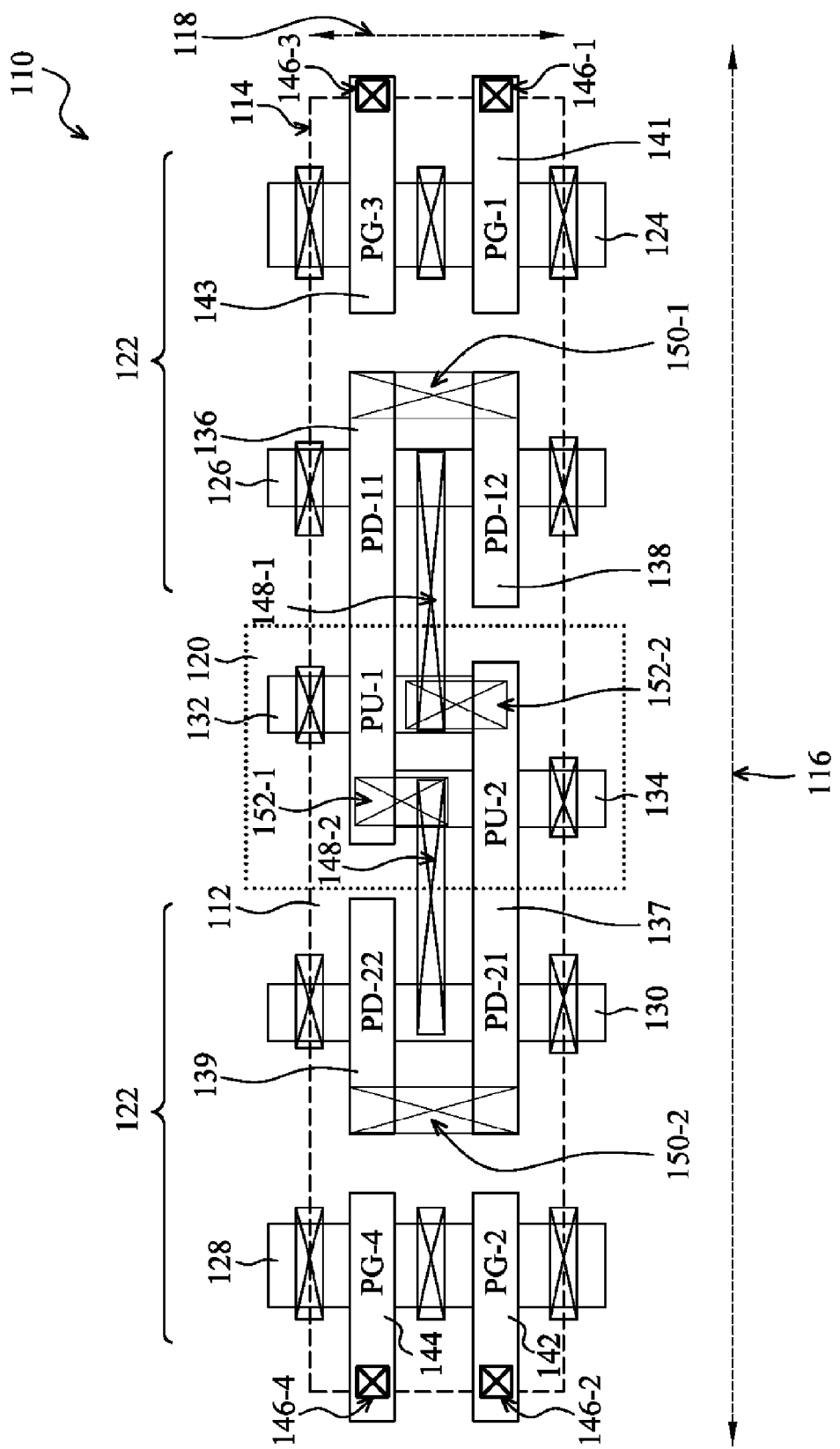

Other contact features are present in the SRAM cell 110 and are illustrated in FIG. 6. Those other contact features are shown in FIG. 6 (instead of in FIG. 5) only for understanding and clarification. It is not mean that those other contact features are formed afterward. Particularly, in one embodiment, the contact features in FIG. 5 and other contact features newly presented are formed simultaneously in a same fabrication procedure. FIG. 6 illustrates a top view of the DP SRAM cell 110. The SRAM cell 110 includes one (or more) long gate contact feature 150 configured to contact and connect adjacent gates. The long gate contact feature 150 has an elongated shape and its length spans in the second direction while the adjacent gates are oriented in the first direction. In the present embodiment, the SRAM cell 110 includes long gate contact features 150-1 and 150-2. The long gate contact feature 150-1 is configured to land on both gates 136 and 138 such that the gates 136 and 138 are electrically connected. By the long gate contact feature 150-1, a U-shaped gate structure and the corresponding rounding issue are eliminated. Similarly, the long gate contact feature 150-2 is configured to land on both gates 137 and 139 such that the gates 137 and 139 are electrically connected.

The SRAM cell 110 also includes one (or more) gate contact feature 152 disposed in the N-well 120 and configured to contact a gate in the N-well 120. In one embodiment, the gate contact feature 152 has an elongated shape and the length dimension spans in the second direction. In the present embodiment, the SRAM cell 110 includes two gate contact features 152-1 and 152-2. The gate contact feature 152-1 lands on and connects to the gate 136. The gate contact feature 152-2 lands on and connects to the gate 137. In one embodiment, the gate contact feature 152 is configured to contact a gate and is extended to further contact an active region. For example, the gate contact feature 152-1 is configured to contact the gate 136 associated with PU-1 and is extended in the second direction to further contact the drain of the PU-2. Similarly, the gate contact feature 152-2 is configured to contact the gate 137 associated with PU-2 and is extended in the second direction to further contact the drain of the PU-1. In another embodiment, the active contact feature 148-1 is extended to be merged with the gate contact feature 152-2 such that the corresponding features (the common drain of PD-11 and PD-12, the drain of PU1 and the gate of PU-2) are electrically connected by the merged contact feature. In another embodiment, similarly, the active contact feature 148-2 is extended to be merged with the gate contact feature 152-1 such that the corresponding features (the common drain of PD-21 and PD-22, the drain of PU2 and the gate of PU-1) are electrically connected by the merged contact feature.

Figure 7:
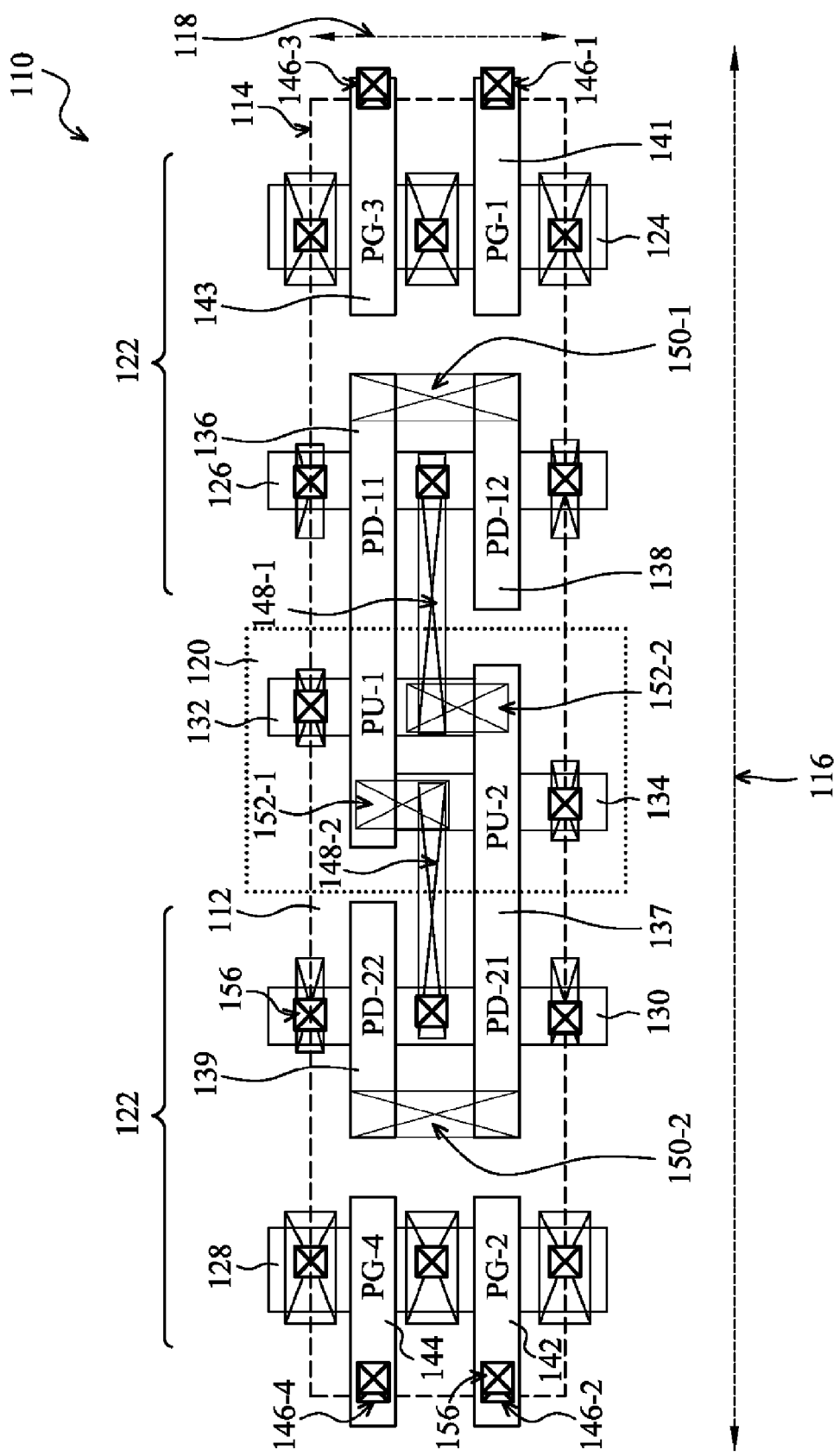

The SRAM cell 110 further includes other interconnect features illustrated in FIG. 7 in a top view constructed according to various embodiments. In one embodiment, the SRAM cell 110 includes a via zero (Via-0) layer below the first metal (M1) layer and disposed between the contact layer and the M1 layer. The Via-0 layer includes various Via-0 features 156 interposed between an underlying contact feature in the contact layer and an overlying metal line in the M1 layer and contacts the underlying contact feature and the overlying metal line. The Via-0 layer is included in the SRAM cell 110 to provide space enhancement such that various features are properly coupled in a high packing layout.

Figure 8:
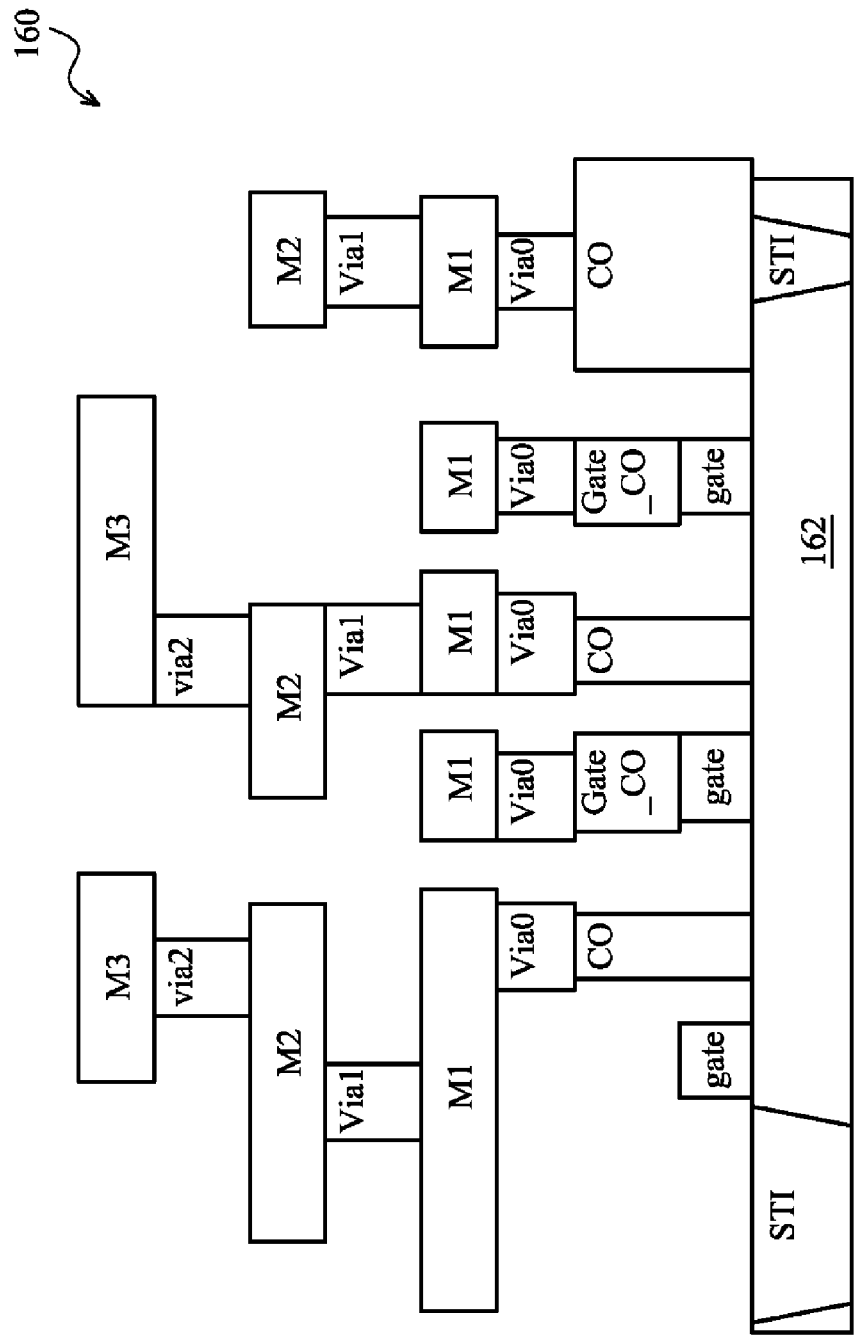
FIG. 8 is a sectional view of an interconnect structure incorporated in the DP SRAM cell structure of FIG. 7 constructed according to one embodiment.

The Via-0 layer and Via-0 features are further described with a reference to FIG. 8 in a sectional view of an interconnect structure 160 formed on a substrate 162. The substrate 162 includes various isolation features (such as STI and labeled as "STI" in FIG. 8) formed therein and defining various active regions separated from each other by the isolation features. Various gates (labeled as "gate") are formed on the active regions of the substrate 162. The interconnect structure 160 includes contact features such as active contact features (labeled as "CO") and gate contact features (labeled as "Gate_CO"). The active contact features land on respective active regions and the gate contact features land on respective gates.

The interconnect structure 160 also includes various metal layers, such as the first metal layer ("M1"), the second metal layer ("M2") and the third metal layer ("M3") successively disposed on the substrate 162 and vertically connected by via features in respective via layers, such as the first via layer ("Via1") between the M1 and M2 layers and the second via layer ("Via2") between the M2 and M3 layers.

Particularly, the interconnect structure 160 includes additionally a via zero layer ("Via-0") disposed between the contact layer and M1 layer. The Via-0 features in the Via-0 layer are configured to contact the underlying contact feature in the contact layer and the overlying metal line in the M1 layer. The Via-0 features in the Via-0 layer provide space enhancement such that contact features properly electrically connected with respective metal lines in the M1 layer, especially in a high packing layout. For example, adjacent gates are close to each other, leaving limited space between the adjacent gates. A contact feature may have a small dimension in the top view such that the contact feature is able to fit in the limited space. The corresponding Via-0 feature may have a greater dimension to land on the underlying contact feature and still have dimension large enough such that the overlying metal line is able to land on the Via-0 feature.

Referring back to FIG. 7, the SRAM cell 110 includes Via-0 features 156 disposed on respective contact features. The Via-0 features 156 are shown in FIG. 7 as  that are similar to those for the contact features but are shadowed for differentiation. The Via-0 features 156 are not individually labeled in FIG. 7 for simplicity.

Figure 9:
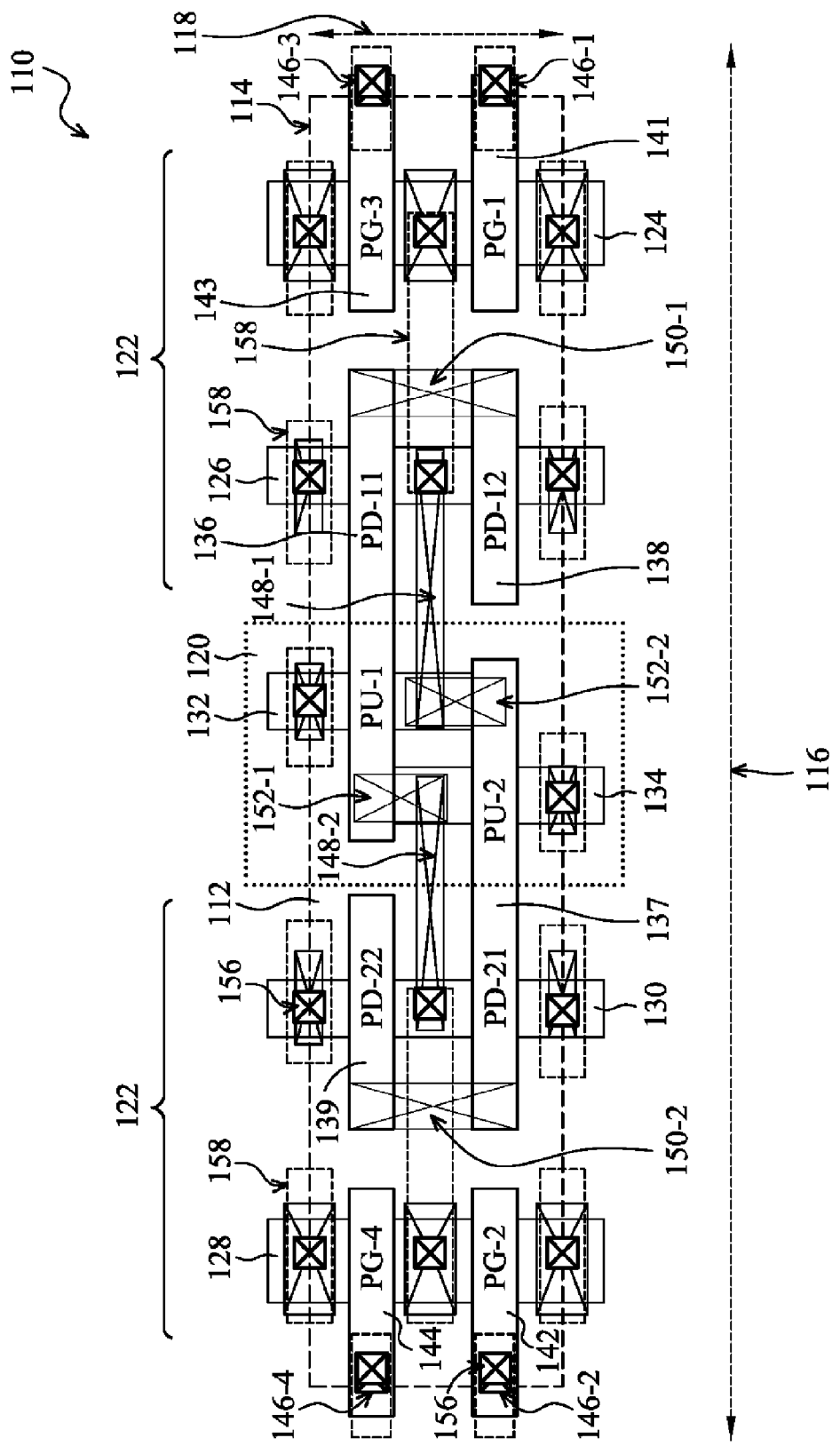

Referring to FIG. 9, the SRAM cell 110 further includes metal lines, such as metal lines 158 in the M1 layer to land on the respective Via-0 features. The metal lines 158 are shown in FIG. 9 as rectangle with dashed lines for differentiation. The metal lines 158 are not individually labeled in FIG. 9 for simplicity. The metal lines 158 may have an elongated shape. In one embodiment, the metal lines 158 are oriented in the first direction 116.

Figure 10:
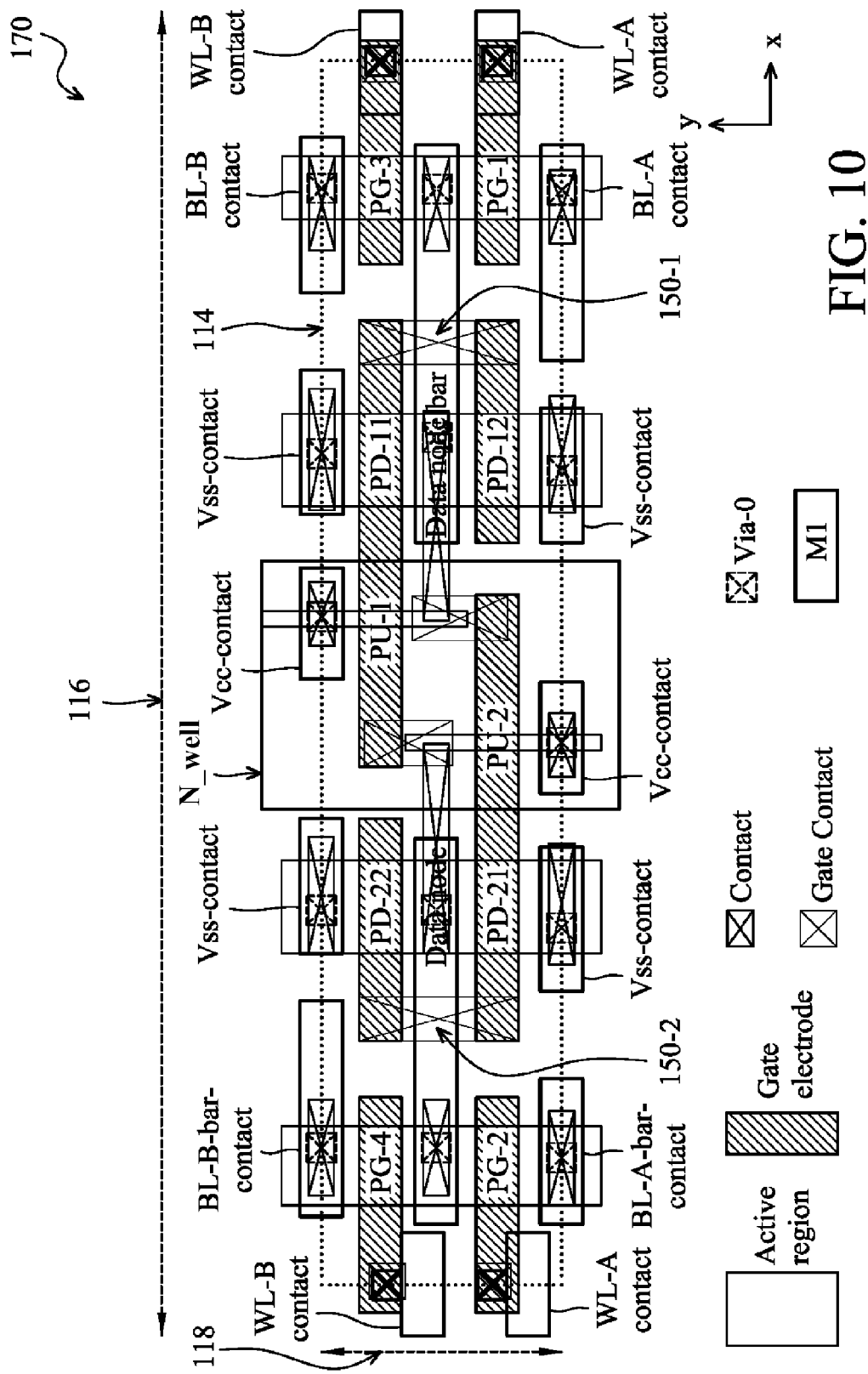
FIG. 10 is a top view of a DP SRAM cell constructed according to various aspects of the present disclosure in various embodiments.

FIG. 10 is a top view of a DP SRAM cell 170 constructed according to one or more embodiments. The DP SRAM cell 170 is similar to the DP SRAM cell 110. The DP SRAM cell 170 includes pull-down devices (PD-11, PD-12, PD-21 and PD-22), pull-up devices (PU-1 and PU-2), and pass-gate devices (PG-1, PG-2, PG-3 and PG-4) configured to cross-coupled two inverters for data storage and two ports for reading and writing. Particularly, the DP SRAM cell 170 includes one (or more) long gate contact feature 150 configured to contact and connect adjacent gates. The long gate contact feature 150 has an elongated shape and its length spans in the second direction 118 while the adjacent gates are oriented in the first direction. In the present embodiment, the SRAM cell 170 includes long gate contact features 150-1 and 150-2. The long gate contact feature 150-1 is configured to land on the adjacent gates associated with pull-down devices PD-11 and PD-12 such that the adjacent gates are electrically connected. By the long gate contact feature 150-1, a U-shaped gate structure and the corresponding rounding issue are eliminated. Similarly, the long gate contact feature 150-2 is configured to land on the adjacent gates associated with pull-down devices PD-21 and PD-22 such that the adjacent gates are electrically connected. In another embodiment, the SRAM cell 170 includes Via-0 features disposed on respective contact features.

Figure 11:
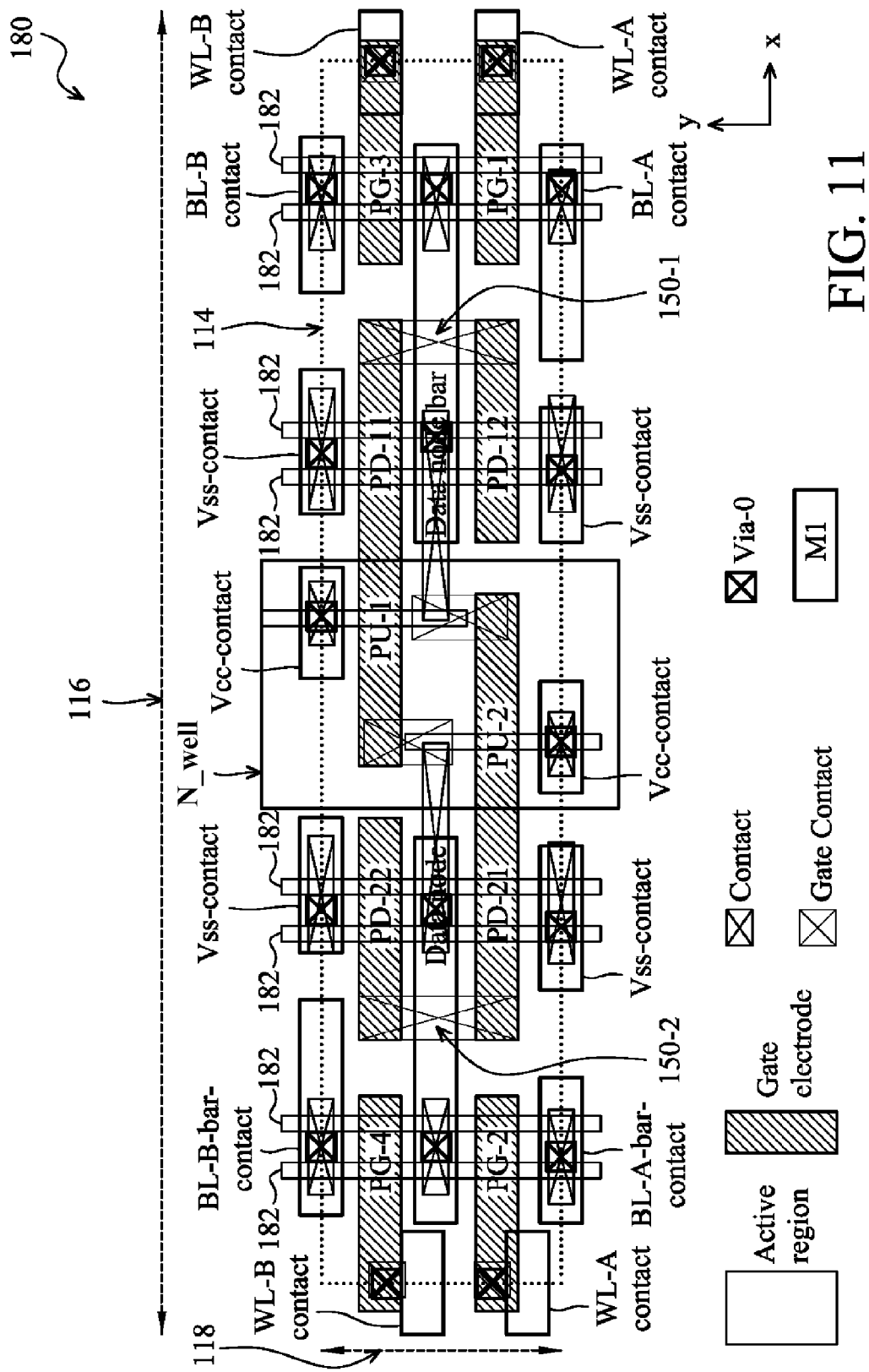
FIG. 11 is a top view of a DP SRAM cell constructed according to various aspects of the present disclosure in various embodiments.

FIG. 11 is a top view of a DP SRAM cell 180 constructed according to one or more embodiments. The DP SRAM cell 180 is similar to the DP SRAM cell 110 that includes dual ports and long contact features designed to land on and connect two adjacent gates. The descriptions of similar features and configurations are not repeated here.

In the present embodiment, the DP SRAM cell 180 includes fin-like active features 182. Accordingly, various pull-up devices, pull-down devices and pass-gate devices in the DP SRAM cell 180 are FinFETs. FinFETs have enhanced performance due to multiple gate coupling (referred to as double gate or triple gate) and have high packing density. Each active region may include one or more fin-like active features. In the present embodiment, each active region for the pull-down devices and pass-gate devices includes two fin-like active features. For example, the active region for the pull-down devices PD-11 and PD-12 includes two fin-like active features 182. Similarly, the active region for the pull-down devices PD-21 and PD-22 includes two fin-like active features 182. The active region for the pass-gate devices PG-1 and PG-3 includes two fin-like active features 182. The active region for the pass-gate devices PG-2 and PG-4 includes two fin-like active features 182 as well.

The DP SRAM cell 180 includes pull-down devices (PD-11, PD-12, PD-21 and PD-22), pull-up devices (PU-1 and PU-2), and pass-gate devices (PG-1, PG-2, PG-3 and PG-4) configured to cross-coupled two inverters for data storage and two ports for reading and writing.

Particularly, the DP SRAM cell 180 includes one (or more) long gate contact feature 150 configured to contact and connect adjacent gates. The long gate contact feature 150 has an elongated shape and its length spans in the second direction 118 while the adjacent gates are oriented in the first direction. In the present embodiment, the SRAM cell 180 includes long gate contact features 150-1 and 150-2. The long gate contact feature 150-1 is configured to land on the adjacent gates associated with pull-down devices PD-11 and PD-12 such that the adjacent gates are electrically connected. Similarly, the long gate contact feature 150-2 is configured to land on the adjacent gates associated with pull-down devices PD-21 and PD-22 such that the adjacent gates are electrically connected. As noted above, a U-shaped gate introduced rounding effect that degrades the gate quality. The rounding effect in the FinFET structure is more severe because the FinFET structure is not planar but 3-dimensional. By using the long contact feature 150 to connect adjacent gates, the proper gate connection is achieved without using U-shaped gate.

In another embodiment, the SRAM cell 180 includes Via-0 features disposed on respective contact features. Each Via-0 feature contacts the underlying contact feature in the contact layer and the overlying metal line in the M1 layer.

Figure 12:
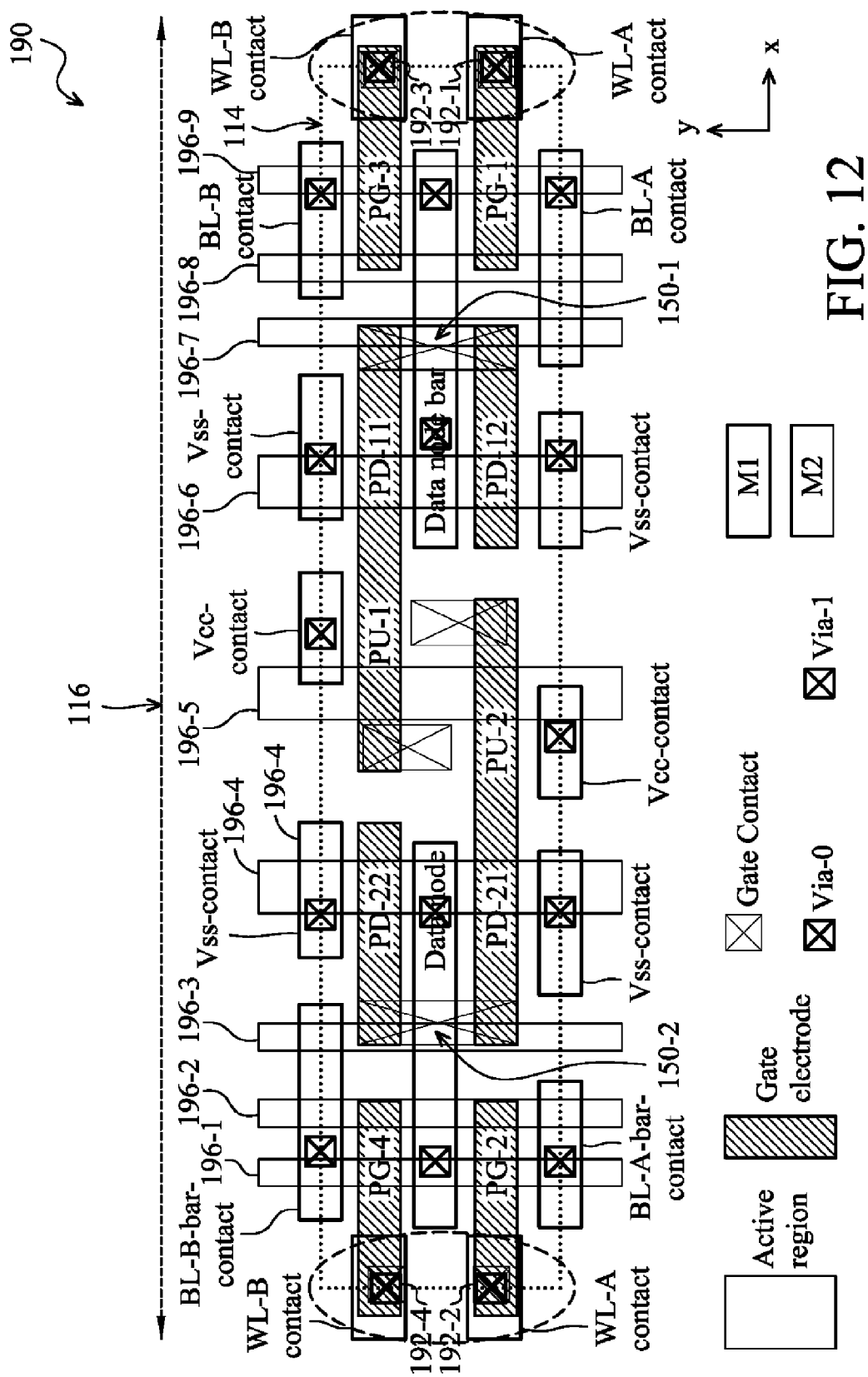
FIG. 12 is a top view of a DP SRAM cell constructed according to various aspects of the present disclosure in various embodiments.
Figure 13:
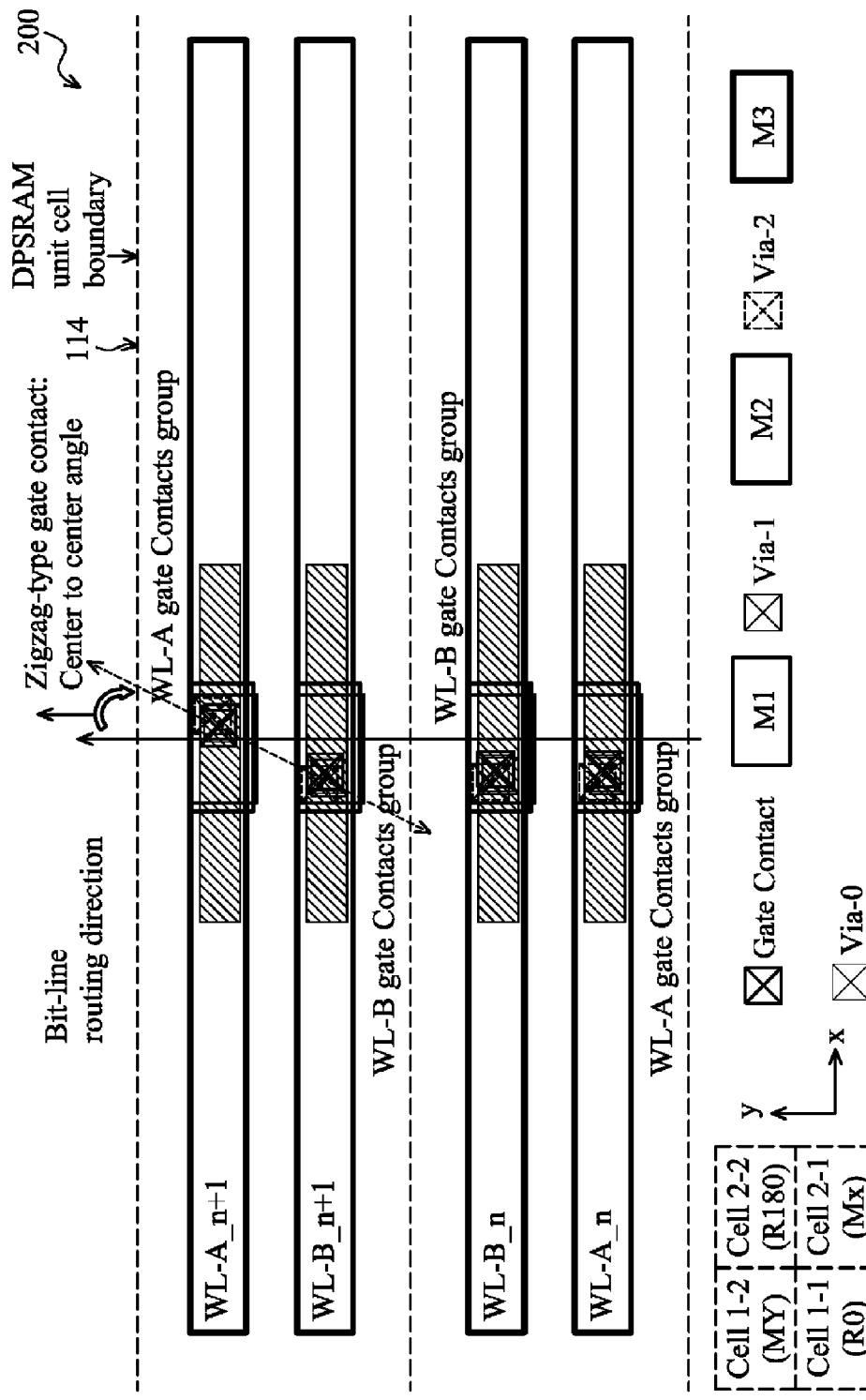
FIG. 13 is a sectional view of a DP SRAM structure having a plurality cells constructed according to one embodiment.

FIG. 12 is a top view of a DP SRAM cell 190 constructed according to one or more embodiments. The DP SRAM cell 190 is similar to the DP SRAM cell 110 in some aspects but has an asymmetric gate contact structure for the gate connections of the pass-gate devices. The descriptions of the similar features and configurations are not repeatedly for simplicity. The DP SRAM cell 190 includes pull-down devices (PD-11, PD-12, PD-21 and PD-22), pull-up devices (PU-1 and PU-2), and pass-gate devices (PG-1, PG-2, PG-3 and PG-4) configured to cross-coupled two inverters for data storage and two ports for reading and writing. FIG. 12 only illustrates the DP SRAM cell 190, in portion. For example, the active regions are not shown for simplicity. The active regions may be similar to the active regions of FIG. 10 (planar active regions) or the active regions of FIG. 11 (fin-like active regions). Various interconnect features are shown in FIG. 12 and are further described below.

The SRAM cell 190 includes various contact features, via features and metal lines. In one embodiment, the DP SRAM cell 190 includes one (or more) long gate contact feature 150 configured to contact and connect adjacent gates. The long gate contact feature 150 has an elongated shape and its length spans in the second direction 118 while the adjacent gates are oriented in the first direction. In the present embodiment, the SRAM cell 190 includes long gate contact features 150-1 and 150-2. The long gate contact feature 150-1 is configured to land on the adjacent gates associated with pull-down devices PD-11 and PD-12 such that the adjacent gates are electrically connected. By the long gate contact feature 150-1, a U-shaped gate structure and the corresponding rounding issue are eliminated. Similarly, the long gate contact feature 150-2 is configured to land on the adjacent gates associated with pull-down devices PD-21 and PD-22 such that the adjacent gates are electrically connected. In another embodiment, the SRAM cell 190 includes Via-0 features disposed on respective contact features.

Particularly, the SRAM cell 190 includes an asymmetric gate contact features for the gate connections to the pass-gate devices. The SRAM cell 190 includes gate contact features 192-1, 192-2, 192-3 and 192-4 configured to land on and contact the gates for the pass-gate devices PG-1, PG-2, PG-3 and PG-4, respectively. The gate contact features 192-1, 192-2, 192-3 and 192-4 are disposed in an asymmetric configuration. The gate contact features 192-1 and 192-3 are disposed on a first edge and the gate contact features 192-2 and 192-4 are disposed on a second edge. The first and second edges span in the first direction (X direction). The gate contact features 192-1 and 192-3 offset from each other in the first direction. Similarly, the gate contact features 192-2 and 192-4 offset from each other in the first direction.

Specially, the gate contact features 192-1, 192-2, 192-3 and 192-4 are respectively shared with adjacent cells. The asymmetric configuration of the gate contact features 192 of the pass-gate devices are further illustrated in FIG. 13 of a SRAM structure 200 in a top view. The SRAM structure 200 includes exemplary four SRAM cells (Cell 1-1, Cell 1-2, Cell 2-1 and Cell 2-2), in portion, with cell boundaries illustrated in dashed lines. Four gate contact features 202, 204, 206 and 208 are disposed in the four cells to provide gate connections of the pass-gate devices of the four SRAM cells. When looking from center to center of those gate contact features, the gate contact features 202, 204, 206 and 208 are positioned in a zigzag configuration. If the SRAM cell in FIG. 12 is the cell 2-2, the gate contact features 202 and 204 are the gate contact features 192-4 and 192-2, respectively. More specifically, the gate contact feature 202 is disposed in the SRAM cell 2-2 and is shared with the SRAM cell 1-2 while the gate contact feature 204 is disposed in the SRAM cell 1-2 and is share with the SRAM cell 2-2.

The pass-gate contact features 202-208 are disposed in a zigzag configuration through a plurality of SRAM cells. The pass-gate contact features are zigzag configured and repeated along the second direction (Y direction). A third direction Z is defined as a direction perpendicular to the substrate (perpendicular to both X and direction). In one embodiment, such zigzag configuration is repeated along the Z direction through via layers. The metal lines are similarly configured to be aligned to the corresponding via features.

Referring back FIG. 12, the SRAM cell 190 further includes Via-0 features configured to provide vertical connection between the underlying contact features and the overlying metal lines in the M1 layer for space enlargement.

The SRAM cell further includes first metal lines ("M1") in the M1 layer and second metal lines ("M2") in the M2 layer, configured to provide electrical routing to the SRAM cell for various operations including reading and writing. In the present embodiment, the first metal lines in the M1 layer are oriented in the first direction (X direction) and the second metal lines in the M2 layer are oriented in the second direction (Y direction). The first metal lines are configured to vertically contact the respective Via-0 features. The second metal lines (labeled as 196-1 through 196-9) are configured to connect to the first metal lines through respective via features ((Via-1") and further coupled to various inputs including power lines. For example, the second metal line 196-5 is routed to the power line Vdd. In another example, the second lines 196-4 and 196-6 are routed to the complimentary power line Vss.

Figure 14:
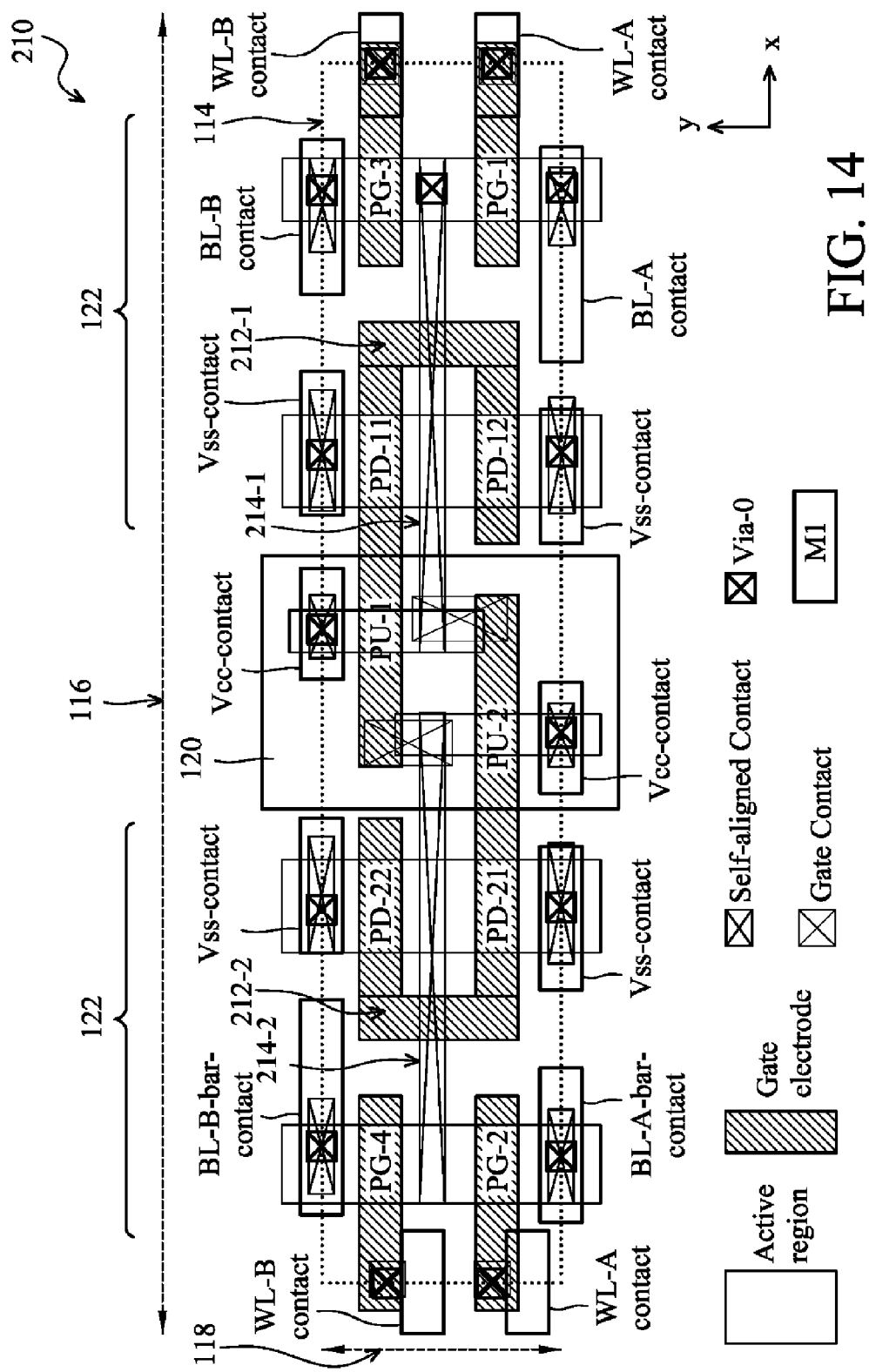
FIG. 14 is a top view of a DP SRAM cell or a portion thereof constructed according to various aspects of the present disclosure in various embodiments.

FIG. 14 is a top view of a DP SRAM cell 210 constructed according to one or more embodiments. The DP SRAM cell 180 includes pull-down devices (PD-11, PD-12, PD-21 and PD-22), pull-up devices (PU-1 and PU-2), and pass-gate devices (PG-1, PG-2, PG-3 and PG-4) configured to cross-coupled two inverters for data storage and two ports for reading and writing. The similar features and configurations in the DP SRAM cell 210 are not repeated for simplicity.

In the SRAM cell 210, the various FETs to form pull-down devices, pull-up devices and pass-gate devices are formed using planar active regions. In this case, a U-shaped gate structure is used with long self-aligned contact features to reduce various concerns including the issue associated with space limitation.

As illustrated in FIG. 14, two U-shaped gates 212 are formed and disposed on the SRAM cell 210. A first U-shape gate 212-1 is disposed on a first portion (the right portion in this case) of the SRAM cell and a second U-shape gate 212-1 is disposed on a second portion (the left portion in this case) of the SRAM cell. Each U-shaped gate includes three segments (first, second and third segments) connected together. The first and third segments are oriented in the first direction. The second segment is oriented in a second direction. The second segment directly connects to the first segment in one end and the third segment in another end.

The first U-shaped gate 212-1 is disposed on the P-well 122 and the first segment is extended into the N-well 120. The first U-shaped gate 212-1 forms a continuous gate for PD-11, PD-12 and PU-1. The second U-shaped gate 212-2 is disposed on the P-well 122 and the first segment of the U-shaped gate 212-2 is extended into the N-well 120. The second U-shaped gate 212-2 forms a continuous gate for PD-21, PD-22 and PU-2.

Particularly, the DP SRAM cell 210 includes one or more long self-aligned contact features 214. The long self-aligned contact features 214 are disposed on respective active regions and contact the respective active region. The long self-aligned contact features 214 are self-aligned between the respective gates. In the present embodiment, the SRAM cell 210 includes long self-aligned contact features 214-1 and 214-2. Taking long self-aligned contact feature 214-1 as an example, the long self-aligned contact feature 214-1 is oriented in the first direction and disposed between the gates for PG-1 and PG-3 that are parallel and oriented in the same direction. The long self-aligned contact feature 214-1 further extends to between the two parallel segments (first and third segments) oriented in the first direction) of the long U-shaped gate 212-1. In one method to form the long self-aligned contact feature 214-1, an interlayer dielectric (ILD) layer is disposed on the gates and the substrate. An etch process is applied to the ILD layer through en etch mask (such as patterned resist layer or hard mask). The etch process selectively etch the ILD material without etching the corresponding gates and therefore the contact trench is aligned with the active regions in the gaps between the parallel gates. Even though the openings defined in the etch mask are not fully aligned with the active regions, due to the selective etch of the etch process, the contact trench is self-aligned with the active regions between the parallel gates (such as the active regions between the gates of the PG-1 and PG-3).

In another embodiment when double patterning (or multiple patterning) technology is employed, the active contact trenches and gate contact trenches are separately patterned. The etch process to etch the active contact trench is tuned to selectively etch the ILD material but not the gate material (the top material layer on the gate is the gate patterning hard mask the sidewall material layer is the gate spacer). Therefore, the long self-aligned contact feature 214-1 is self-aligned between the gate spacers and physically contacts the gate spacers.

In another embodiment, the SRAM cell 110 includes a via zero (Via-0) layer below the first metal (M1) layer and disposed between the contact layer and the M1 layer. The Via-0 layer includes various Via-0 features interposed between an underlying contact feature in the contact layer and an overlying metal line in the M1 layer and contacts the underlying contact feature and the overlying metal line. The Via-0 features enlarge the landing area such that the overlying metal lines easily land on and connect the overlying self-aligned contact.

Figure 15:
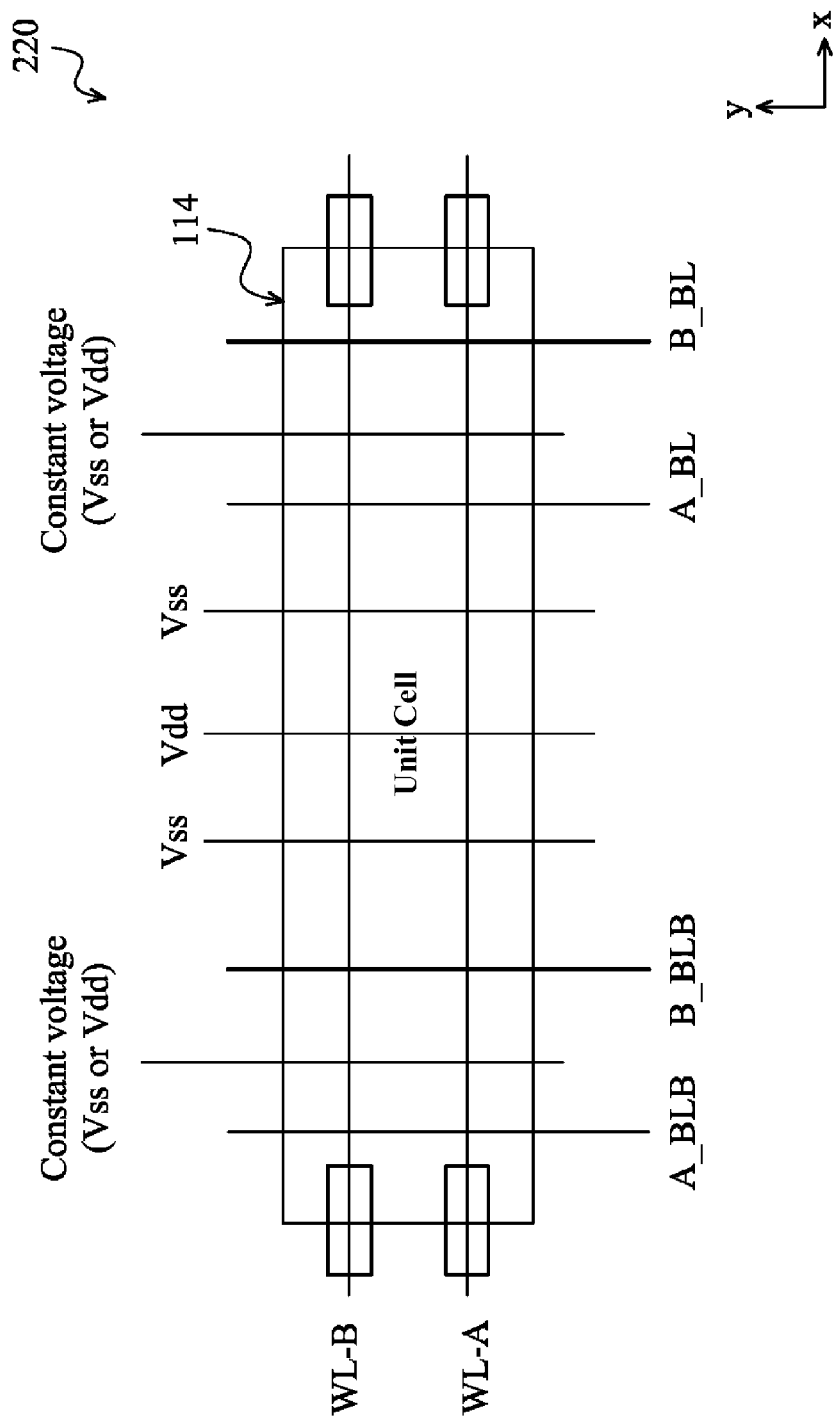
FIG. 15 is a schematic view of a DP SRAM structure constructed according to various aspects of the present disclosure in one embodiment.

FIG. 15 is a top view of a SRAM structure 220 constructed according to one embodiment. The SRAM structure 220 includes a portion of an interconnect structure disposed on a SRAM cell, such as the SRAM cell 110. The SRAM structure 220 includes metal lines in a second metal layer (M2) and metal lines in the third metal layer (M3) and further includes via features in the via layer between the M2 and M3 layers. The metal lines in the M2 layer are oriented in the second direction (Y direction) and the metal lines in the M3 layer are oriented in the first direction (X direction). The metal lines in the M2 layer are respectively connected to power lines (Vdd, Vss, or constant voltage lines such as Vss or Vdd) and bit lines (A-BLB, B_BLB, A-BL and B_Bl) as illustrated in FIG. 15. The metal lines in the M3 layer are respectively connected to word lines (WL-A and WL-B).

Figure 16:
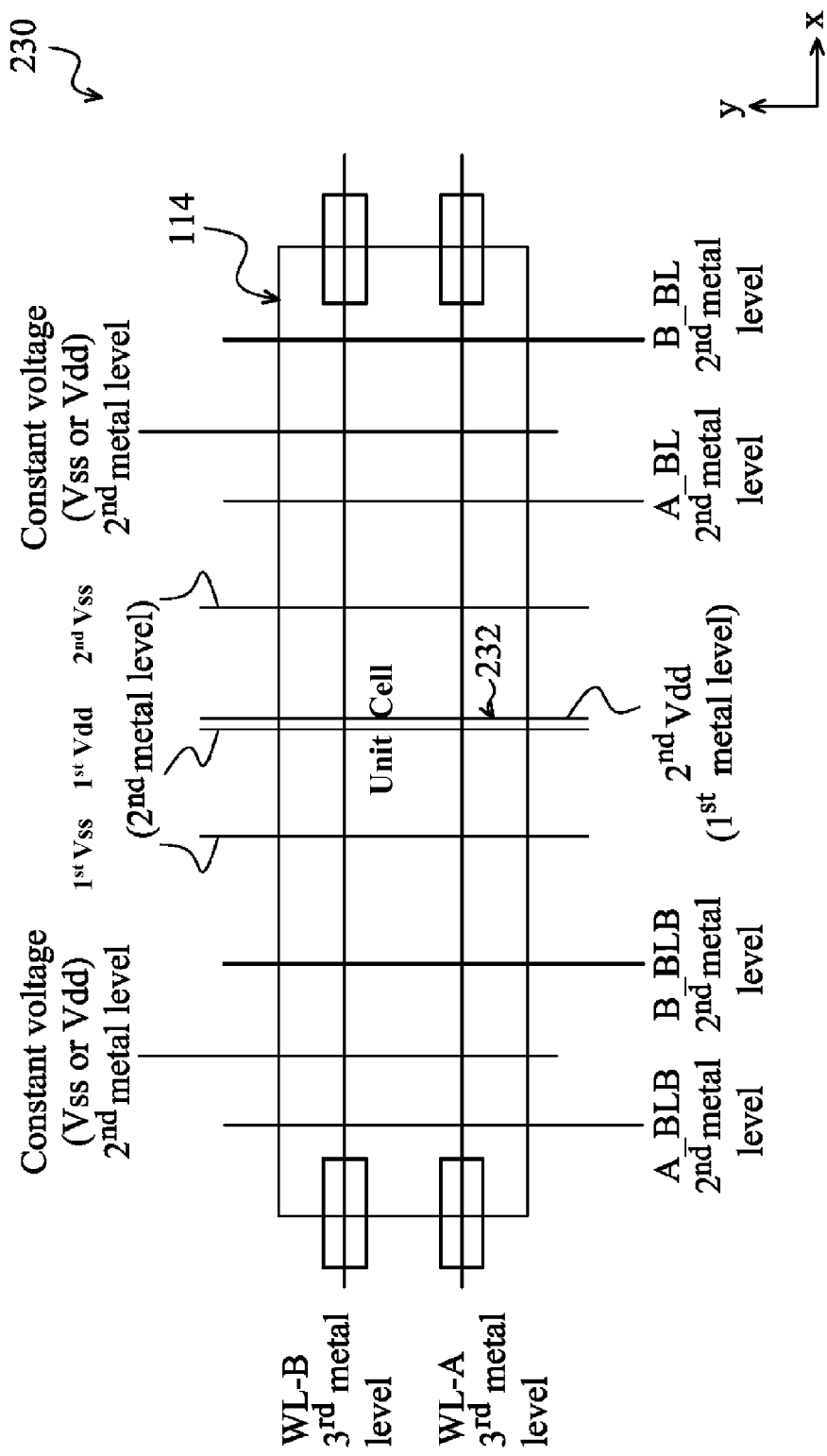
FIG. 16 is a schematic view of a DP SRAM structure constructed according to various aspects of the present disclosure in another embodiment.

FIG. 16 is a top view of a SRAM structure 230 constructed according to one embodiment. The SRAM structure 230 includes a portion of an interconnect structure disposed on a SRAM cell, such as the SRAM cell 110. The SRAM structure 230 includes metal lines in a first metal layer (M1), metal lines in a second metal layer (M2) and metal lines in the third metal layer (M3). In the present embodiment, a metal line 232 in the M1 layer is connected to a power line Vdd and is oriented in the second direction (Y direction). Other metal lines in the M1 layer may present to provide cell local connections and landing pads. The metal lines in the M2 layer are oriented in the second direction (Y direction). The metal lines in the M2 layer are respectively connected to power lines (Vdd, Vss,), shielding lines and bit lines (A-BLB, B_BLB, A-BL and B_Bl) as illustrated in FIG. 16. The metal lines in the M3 layer are oriented in the first direction (X direction). The metal lines in the M3 layer are respectively connected to word lines (WL-A and WL-B).

Figure 17:
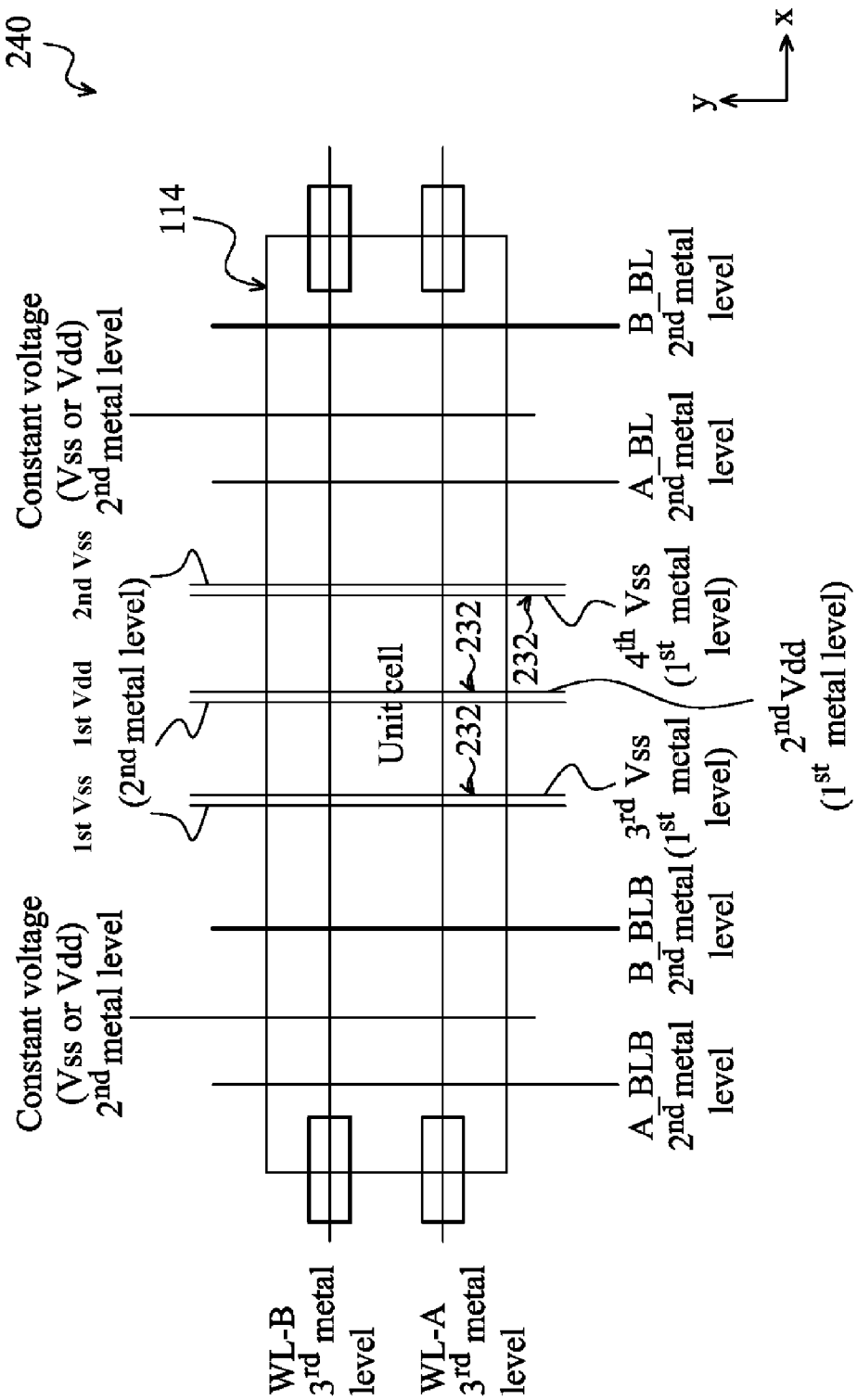
FIG. 17 is a schematic view of a DP SRAM structure constructed according to various aspects of the present disclosure in yet another embodiment.

FIG. 17 is a top view of a SRAM structure 240 constructed according to one embodiment. The SRAM structure 240 includes a portion of an interconnect structure disposed on a SRAM cell, such as the SRAM cell 110. The SRAM structure 240 includes metal lines in a first metal layer (M1), metal lines in a second metal layer (M2) and metal lines in the third metal layer (M3). In the present embodiment, the metal lines 232 in the M1 layer are respectively connected to power lines (Vdd and Vss) and are oriented in the second direction (Y direction). Other metal lines in the M1 layer may present to provide cell local connections, Vss power lines and landing pads. The metal lines in the M2 layer are oriented in the second direction (Y direction). The metal lines in the M2 layer are respectively connected to power lines (Vdd, Vss,), shielding lines and bit lines (A-BLB, B_BLB, A-BL and B_Bl) as illustrated in FIG. 17. The metal lines in the M3 layer are oriented in the first direction (X direction). The metal lines in the M3 layer are respectively connected to word lines (WL-A and WL-B).

In various embodiments, the disclosed DP SRAM device addresses various issues noted in the background. The present disclosure provides a dual-port SRAM cell and a layout with multiple pull-sown devices and multiple pass-gate devices configured and coupled through various contact features according different embodiments. The disclosed structure and layout are also good for high-k/metal-gate. One or more other advantages may present in various embodiments. In one example, the long gate contact features provide local connection to the adjacent gates with much great processing for lithography pattern. In another example, the asymmetric gate contact features reduce the issue caused by crowd space, which enhances the space and provides a layout suitable for cell shrinking and layout scaling in the advanced technology nodes. In another example, the fin active features are straight and some are long and continuous to form two FinFETs, such as pull-down devices and/or pass-gate devices, to provide a better device tracking/matching between the pass-gate devices and pull-down devices on a wider range operation voltage (from the highest to the lowest Vdd operation). In another example, the simple shape of the active regions solves pull-down device current crowding issue as well as lithography proximity effect.

Various features and configurations in various embodiments may be combined to present in a SRAM cell. For example, a SRAM cell includes a long gate contact to connect gates for PD-11 and PD-12 (another long gate contact feature to connect gates for PD-11 and PD-12 as well) and further includes an asymmetric gate contact features to contact the gates of the pass-gate devices. In another example, a SRAM cell includes a long gate contact to connect gates for PD-11 and PD-12 (another long gate contact feature to connect gates for PD-11 and PD-12 as well); an asymmetric gate contact features to contact the gates of the pass-gate devices; and self-aligned contact features.

Thus, the present disclosure provides one embodiment of a static random access memory (SRAM) cell that includes first and second inverters cross-coupled for data storage, each inverter including at least one pull-up device and at least two pull-down devices; at least four pass-gate devices configured with the two cross-coupled inverters; at least two ports coupled with the at least four pass-gate devices for reading and writing; a first contact feature contacting first two pull-down devices (PD-11 and PD-12) of the first inverter; and a second contact feature contacting second two pull-down devices (PD-21 and PD-22) of the second inverter.

The present disclosure also provides another embodiment of a static random access memory (SRAM) cell structure that includes first and second inverters cross-coupled for data storage, each inverter including at least one pull-up device and at least two pull-down devices; at least four pass-gate devices (PG1, PG2, PG3 and PG4) configured with the two cross-coupled inverters; at least two ports coupled with the at least four pass-gate devices for reading and writing; and four contact features (C1, C2, C3 and C4) contacting PG1, PG2, PG3 and PG4, respectively. The SRAM cell has an elongated shape oriented in a first direction, and C1, C2, C3 and C4 are configured such that each of C1, C2, C3 and C4 offsets with any others in the first direction.

The present disclosure also provides another embodiment of a static random access memory (SRAM) cell that includes first and second inverters cross-coupled for data storage. The first inverter includes a first pull-up device (PU1) and two pull-down devices (PD-11 and PD-12) and the second inverter includes a second pull-up device (PU2) and other two pull-down devices (PD-21 and PD-22). The SRAM cell also includes a first U-shaped gate physically connecting gate terminals of PD-11 and PD-12; a second U-shaped gate physically connecting gate terminals of PD-21 and PD-22; a first long contact feature contacting a drain of PU1 and a first common drain of PD-11 and PD-12; and a second long contact feature contacting a drain of PU2 and a second common drain of PD-21 and PD-22.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) cell comprising:
    first and second inverters cross-coupled for data storage, each inverter including at least one pull-up device and at least two pull-down devices;
    at least four pass-gate devices configured with the two cross-coupled inverters;
    at least two ports coupled with the at least four pass-gate devices for reading and writing;
    a first elongated contact feature extended in a second direction, the first elongated contact feature directly landing on and contacting respective adjacent gates extended, in a first direction perpendicular to the second direction, of the first two pull-down devices (PD-11 and PD-12) of the first inverter; and
    a second elongated contact feature extended in the second direction, the second elongated contact feature directly landing on and contacting respective adjacent gates extended, in the first direction perpendicular to the second direction, of the second two pull-down devices (PD-21 and PD-22) of the second inverter.

2. The SRAM cell of claim 1, wherein
    PD-11 includes a first gate;
    PD-12 includes a second gate;
    PD-21 includes a third gate;
    PD-22 includes a fourth gate;
    the first elongated contact feature directly lands on the first and second gates; and
    the second elongated contact features directly lands on the third and fourth gates.

3. The SRAM cell of claim 2, wherein
    PD-11 and PD-12 have a first common drain; and
    PD-21 and PD-22 have a second common drain.

4. The SRAM cell of claim 3, wherein
    the first, second, third and fourth gates are elongated and extended in the first direction.

5. The SRAM cell of claim 4, further comprising active regions that are elongated and extended in the second direction, wherein the active regions includes
    a first active region that is underlying the first gate and the second gate; and
    a second active region that is underlying the third gate and the fourth gate.

6. The SRAM cell of claim 5, wherein the active regions further includes
    a third active region approximate to the first active region;
    a fourth active region approximate to the second active region;
    first and second pass-gate devices are formed on the third active region; and
    third and fourth pass-gate devices are formed on the fourth active region.

7. The SRAM cell of claim 6, wherein
    the SRAM cell has an elongated shape that spans a first dimension in the first direction and a second dimension in the second direction;
    the first dimension is greater than the second dimension; and
    the first, second, third and fourth active regions are disposed along the first dimension such that the first and second active regions are between the third and fourth active regions.

8. The SRAM cell of claim 7, further comprising first, second, third and fourth pass-gate contact features contacting the first, second, third and fourth pass-gate devices, respectively, wherein
    the SRAM cell spans from a first edge to a second edge in the first direction;
    the first and second pass-gate contact features are disposed on the first edge of the SRAM cell and are configured to offset from each other in the first direction; and
    the third and fourth pass-gate contact features are disposed on the second edge of the SRAM cell and are configured to offset from each other in the first direction.

9. The SRAM cell of claim 7, further comprising a self-aligned contact features that is elongated and is oriented in the first direction, wherein the self-aligned contact feature contacts the first common drain and another common drain shared between the first and second pass-gate devices.

10. The SRAM cell of claim 9, further comprising a via feature (Via-0) vertically contacting the self-aligned contact feature and a metal line in a first metal layer.

11. The SRAM cell of claim 1, wherein PD-11, PD-12, PD-21 and PD-22 include fin-like field-effect transistors (FinFETs).

12. A static random access memory (SRAM) cell comprising:
    first and second inverters cross-coupled for data storage, each inverter including at least one pull-up device and at least two pull-down devices;
    at least four pass-gate devices (PG1, PG2, PG3 and PG4) configured with the two cross-coupled inverters;
    a first elongated contact feature extended in a second direction, the first elongated contact feature landing on and contacting respective adjacent gates extended, in a first direction perpendicular to the second direction, of the first two pull-down devices (PD-11 and PD-12) of the first inverter; and
    a second elongated contact feature extended in the second direction, the second elongated contact feature landing on and contacting respective adjacent gates extended, in the first direction perpendicular to the second direction, of the second two pull-down devices (PD-21 and PD-22) of the second inverter.

13. The SRAM cell structure of claim 12 further comprising:
four contact features (C1, C2, C3 and C4) contacting PG1, PG2, PG3 and PG4, respectively.

14. The SRAM cell structure of claim 13, wherein
the SRAM cell has an elongated shape oriented in a first direction, and
C1, C2, C3 and C4 are configured such that each of C1, C2, C3 and C4 are offset from one another in the first direction.

15. The SRAM cell structure of claim 13, wherein
the SRAM cell spans a first dimension from a first edge to a second edge in the first direction and a second dimension in a second direction perpendicular to the first direction;
the second dimension is less than the first dimension;
C1 and C3 are disposed at the first edge and are spaced from each other in the first direction;
C2 and C4 are disposed at the second edge and are spaced from each other in the first direction.

16. The SRAM cell structure of claim 13, wherein
PG1, PG2, PG3 and PG4 include first, second, third and fourth gates, respectively;
the first, second, third and fourth gates each has an elongate shape oriented in the first direction; and
C1, C2, C3 and C4 contact the first, second, third and fourth gates, respectively.

17. The SRAM cell structure of claim 13, wherein C1, C2, C3 and C4 are connected to word lines.

18. A static random access memory (SRAM) cell comprising:
first and second inverters cross-coupled for data storage, wherein the first inverter includes a first pull-up device (PU1) and two pull-down devices (PD-11 and PD-12) and the second inverter includes a second pull-up device (PU2) and two other pull-down devices (PD-21 and PD-22);
a first elongated contact feature oriented in a first direction connecting the first two pull-down devices (PD-11 and PD-12) of the first inverter, the first elongated contact feature disposed on and contacting a first active region between first and third gates of pass-gate devices (PG-1 and PG-3), the first and third gates parallel to each other and oriented in the first direction; and
a second elongated contact feature oriented in the first direction connecting the second two pull-down devices (PD-21 and PD-22) of the second inverter, the second elongated contact feature disposed on and contacting a second active region between second and fourth gates of pass-gate devices (PG-2 and PG-4), the second and fourth gates parallel to each other and oriented in the first direction.

19. The SRAM cell structure of claim 18 further comprising:
a first U-shaped gate physically connecting gate terminals of PD-11 and PD-12; and
a second U-shaped gate physically connecting gate terminals of PD-21 and PD-22.

20. The SRAM cell structure of claim 19, wherein:
the first elongated contact feature contacts a drain of PU1 and a first common drain of PD-11 and PD-12; and
the second elongated contact feature contacts a drain of PU2 and a second common drain of PD-21 and PD-22,
the SRAM cell has an elongated shape oriented in the first direction,
the first U-shaped gate includes first, second and third segments, wherein the first and third segments are parallel to each other and are oriented in the first direction, the second segment is oriented in a second direction perpendicular to the first direction, and the second segment directly connects to the first segment in one end and the third segment in another end; and
the first elongated contact feature is disposed between the first and third segments.

* * * * *